(12) United States Patent
Yeo et al.

(10) Patent No.: US 9,614,086 B1
(45) Date of Patent: Apr. 4, 2017

(54) CONFORMAL SOURCE AND DRAIN CONTACTS FOR MULTI-GATE FIELD EFFECT TRANSISTORS

(71) Applicant: Taiwan Semiconductor Manufacturing Company, Ltd., Hsin-Chu OT (TW)

(72) Inventors: Yee-Chia Yeo, Hsinchu (TW); Carlos H. Diaz, Mountain View, CA (US); Chih-Hao Wang, Hsinchu County (TW); Ling-Yen Yeh, Hsinchu (TW); Yuan-Chen Sun, Hsin-Chu (TW)

(73) Assignee: Taiwan Semiconductor Manufacturing Company, Ltd., Hsin-Chu (TW)

( * ) Notice: Subject to any disclaimer, the term of this patent is extended or adjusted under 35 U.S.C. 154(b) by 0 days.

(21) Appl. No.: 14/985,203

(22) Filed: Dec. 30, 2015

(51) Int. Cl.
| | | |
|---|---|---|
| *H01L 21/8238* | (2006.01) | |
| *H01L 29/78* | (2006.01) | |
| *H01L 29/66* | (2006.01) | |
| *H01L 29/10* | (2006.01) | |
| *H01L 23/535* | (2006.01) | |
| *H01L 21/306* | (2006.01) | |

(52) U.S. Cl.
CPC .... *H01L 29/7849* (2013.01); *H01L 21/30604* (2013.01); *H01L 23/535* (2013.01); *H01L 29/1054* (2013.01); *H01L 29/66545* (2013.01); *H01L 29/66553* (2013.01); *H01L 29/66795* (2013.01); *H01L 29/785* (2013.01)

(58) Field of Classification Search
CPC ........... H01L 29/7849; H01L 21/30604; H01L 29/66545; H01L 21/823431; H01L 21/823821; H01L 21/845; H01L 27/0886; H01L 27/10826; H01L 27/1211; H01L 29/41791; H01L 29/7831; H01L 29/785
USPC ........ 257/288, 368, 369; 438/151, 206, 197, 438/199
See application file for complete search history.

(56) References Cited

U.S. PATENT DOCUMENTS

| | | | |
|---|---|---|---|
| 7,199,430 B2 | 4/2007 | Babcock et al. | |
| 7,262,086 B2 | 8/2007 | Yeo et al. | |
| 7,667,271 B2 | 2/2010 | Yu et al. | |

(Continued)

OTHER PUBLICATIONS

Saraswat, Krishna et al., "High Mobility MOSFETs," Department of Electrical Engineering, Stanford University, INMP May 14, 2014, 15 pages.

(Continued)

*Primary Examiner* — Jarrett Stark
*Assistant Examiner* — Shahed Ahmed
(74) *Attorney, Agent, or Firm* — Haynes and Boone, LLP

(57) ABSTRACT

A semiconductor device includes a fin having a first semiconductor material. The fin includes a source/drain (S/D) region and a channel region. The S/D region provides a top surface and two sidewall surfaces. A width of the S/D region is smaller than a width of the channel region. The semiconductor device further includes a semiconductor film over the S/D region and having a doped second semiconductor material. The semiconductor film provides a top surface and two sidewall surfaces that are substantially parallel to the top and two sidewall surfaces of the S/D region respectively. The semiconductor device further includes a metal contact over the top and two sidewall surfaces of the semiconductor film and operable to electrically communicate with the S/D region.

20 Claims, 17 Drawing Sheets

(56) References Cited

U.S. PATENT DOCUMENTS

| | | | |
|---|---|---|---|
| 7,910,453 B2 | 3/2011 | Xu et al. | |
| 7,955,928 B2 | 6/2011 | Chan et al. | |
| 8,236,634 B1* | 8/2012 | Kanike | H01L 27/1211 257/E21.431 |
| 8,236,659 B2 | 8/2012 | Tsai et al. | |
| 8,377,779 B1 | 2/2013 | Wang | |
| 8,399,931 B2 | 3/2013 | Liaw et al. | |
| 8,487,378 B2 | 7/2013 | Goto et al. | |
| 8,652,894 B2 | 2/2014 | Lin et al. | |
| 8,686,516 B2 | 4/2014 | Chen et al. | |
| 8,716,765 B2 | 5/2014 | Wu et al. | |
| 8,723,272 B2 | 5/2014 | Liu et al. | |
| 8,729,627 B2 | 5/2014 | Cheng et al. | |
| 8,729,634 B2 | 5/2014 | Shen et al. | |
| 8,735,993 B2 | 5/2014 | Lo et al. | |
| 8,736,056 B2 | 5/2014 | Lee et al. | |
| 8,742,492 B2 | 6/2014 | Chuang et al. | |
| 8,754,470 B1 | 6/2014 | Chuang et al. | |
| 8,772,109 B2 | 7/2014 | Colinge | |
| 8,785,285 B2 | 7/2014 | Tsai et al. | |
| 8,815,691 B2 | 8/2014 | Colinge et al. | |
| 8,816,444 B2 | 8/2014 | Wann et al. | |
| 8,823,065 B2 | 9/2014 | Wang et al. | |
| 8,826,213 B1 | 9/2014 | Ho et al. | |
| 8,860,148 B2 | 10/2014 | Hu et al. | |
| 8,887,106 B2 | 11/2014 | Ho et al. | |
| 2011/0073952 A1* | 3/2011 | Kwok | H01L 29/045 257/368 |
| 2011/0272763 A1* | 11/2011 | Sasaki | H01L 29/7854 257/347 |
| 2012/0083107 A1 | 4/2012 | Chang et al. | |
| 2013/0040455 A1 | 2/2013 | Chan et al. | |
| 2014/0001574 A1 | 1/2014 | Chen et al. | |
| 2014/0110755 A1 | 4/2014 | Colinge | |
| 2014/0134818 A1 | 5/2014 | Cheng et al. | |
| 2014/0151812 A1 | 6/2014 | Liaw | |
| 2014/0282326 A1 | 9/2014 | Chen et al. | |
| 2015/0145066 A1 | 5/2015 | Lu et al. | |
| 2015/0318381 A1 | 11/2015 | Tsai et al. | |
| 2016/0181404 A1 | 6/2016 | Wen et al. | |

OTHER PUBLICATIONS

U.S. Appl. No. 14/597,115, filed Jan. 14, 2015, by inventors Chun Hsiung Tsai et al. for "Metal-Insensitive Epitaxy Formation," 18 pages of text, 5 pages of drawings.

Michael I. Current et al., "Microwave and RTA Annealing of Phos-Doped, Strained Si(100) and (110) Implanted with Molecular Caron Ions," Ion Implantation and Annealing: New Process and Products section of SEMICON West 2013, San Francisco CA., Jul. 11, 2013, 17 pages, Junction Technology Group.

Bo Lojek, "Low Temperature Microwave Annealing of S/D," 16th IEEE International Conference on Advanced Thermal Processing of Semiconductors—RTP2008, 9 pages.

D. Hisamoto et al., "FinFET—A self-aligned double-gate MOSFET scalable to 20 nm," IEEE Trans. Electron Devices, vol. 47, No. 12, pp. 2320-2325, Dec. 2000.

X. Huang et al., "Sub-50 nm P-channel FinFET," IEEE Trans. Electron Devices, vol. 48, No. 5, pp. 880-886, May 2001.

J. Kedzierski et al., "Extension and source/drain design for high performance FinFET devices," IEEE Trans. Electron Devices, vol. 50, No. 4, pp. 952-958, Apr. 2003.

J. Kedzierski et al., "Fabrication of metal gated FinFETs through complete gate silicidation with Ni," *IEEE Trans. Electron Devices*, vol. 51, No. 12, pp. 2115-2120, Dec. 2004.

J. Kavalieros et al., "Tri-gate transistor architecture with high-k gate dielectrics, metal gates and strain engineering," in Proc. Symp. VLSI Technology, 2006, pp. 50-51.

C.-C. Yeh et al., "A low operating power FinFET transistor module featuring scaled gate stack and strain engineering for 32/28 nm SoC technology," in Proc. IEEE International Electron Device Meeting, Dec. 2010, p. 772.

C. Auth et al., "A 22 nm high performance and low-power CMOS technology featuring fully-depleted tri-gate transistors, self-aligned contacts and high density MIM capacitors," in Proc. Symp. VLSI Technology, Jun. 2012, pp. 131-132.

T.-Y. Liow et al., "Strained N-channel FinFETs with 25 nm gate length and silicon-carbon source/drain regions for performance enhancement," in Proc. Symp. VLSI Technology, 2006, pp. 68-69.

J. T. Park et al., "Multiple-gate SOI MOSFETs: Device design guidelines," IEEE Trans Electron Dev, vol. 49, pp. 2222, 2002.

F.-L. Yang et al., "25 nm CMOS Omega FET," in Proc. IEEE International Electron Device Meeting, 2002, pp. 255.

H. Takato et al., "High performance CMOS surrounding gate transistor (SGT) for ultra high density LSIs," in Proc. IEEE International Electron Device Meeting, Dec. 1988, p. 222.

D.-I. Moon et al., "Investigation of Silicon Nanowire Gate-All-Around Junctionless Transistors Built on a Bulk Substrate," IEEE Trans. Electron Devices, vol. 60, No. 4, pp. 1355-1360, Apr. 2013.

J.-P. Colinge, "Multi-gate SOI MOSFETs," Solid-State Electronics, vol. 48, pp. 897, 2004.

J.-P. Colinge et al., "Junctionless nanowire transistor (JNT): Properties and design guidelines," Solid-State Electronics, vol. 65-66, pp. 33-37, 2011.

S. Bangsaruntip et al., "Density scaling with gate-all-around silicon nanowire MOSFETs for the 10 nm node and beyond," in Proc. IEEE International Electron Device Meeting, Dec. 2013, p. 385.

\* cited by examiner

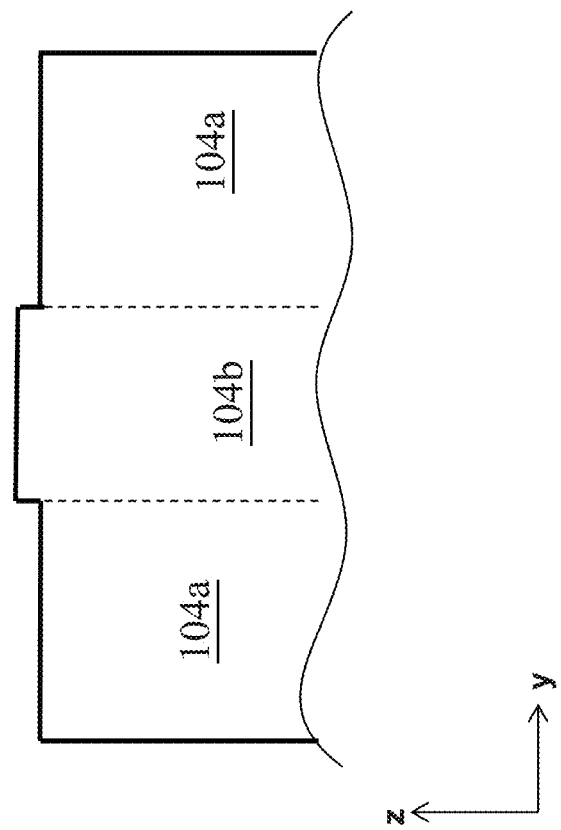
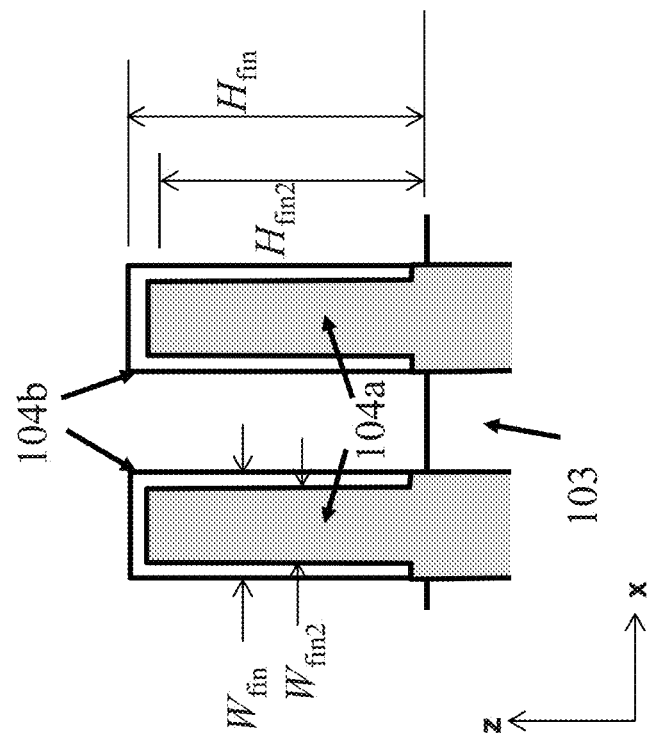
FIG. 7C
FIG. 7D

CONFORMAL SOURCE AND DRAIN CONTACTS FOR MULTI-GATE FIELD EFFECT TRANSISTORS

BACKGROUND

The semiconductor integrated circuit (IC) industry has experienced exponential growth. Technological advances in IC materials and design have produced generations of ICs where each generation has smaller and more complex circuits than the previous generation. In the course of IC evolution, functional density (i.e., the number of interconnected devices per chip area) has generally increased while geometry size (i.e., the smallest component (or line) that can be created using a fabrication process) has decreased. This scaling down process generally provides benefits by increasing production efficiency and lowering associated costs. Such scaling down has also increased the complexity of processing and manufacturing ICs.

For example, multi-gate field effect transistors (FETs) such as fin field effect transistors (FinFETs) have been developed for better gate controllability than traditional planar FETs in short channel transistors. Examples of the multi-gate FinFET include double-gate FET, triple-gate FFET, omega-gate FET, and gate-all-around (or surround-gate) FET. The multi-gate FETs are expected to scale the semiconductor process technology beyond the limitations of the conventional bulk metal-oxide-semiconductor FET (MOSFET) technology. However, as the transistor device structure scales down and becomes three dimensional, the transistor contact resistance exhibits increased impact on the device performance. Therefore, it is desirable to have new contact structures that reduce the contact resistance.

BRIEF DESCRIPTION OF THE DRAWINGS

The present disclosure is best understood from the following detailed description when read with the accompanying figures. It is emphasized that, in accordance with the standard practice in the industry, various features are not drawn to scale and are used for illustration purposes only. In fact, the dimensions of the various features may be arbitrarily increased or reduced for clarity of discussion.

FIGS. 7B, 7C, and 7D are cross-sectional views of the semiconductor device of FIG. 7A, in accordance with some embodiments.

DETAILED DESCRIPTION

Figure 1A:
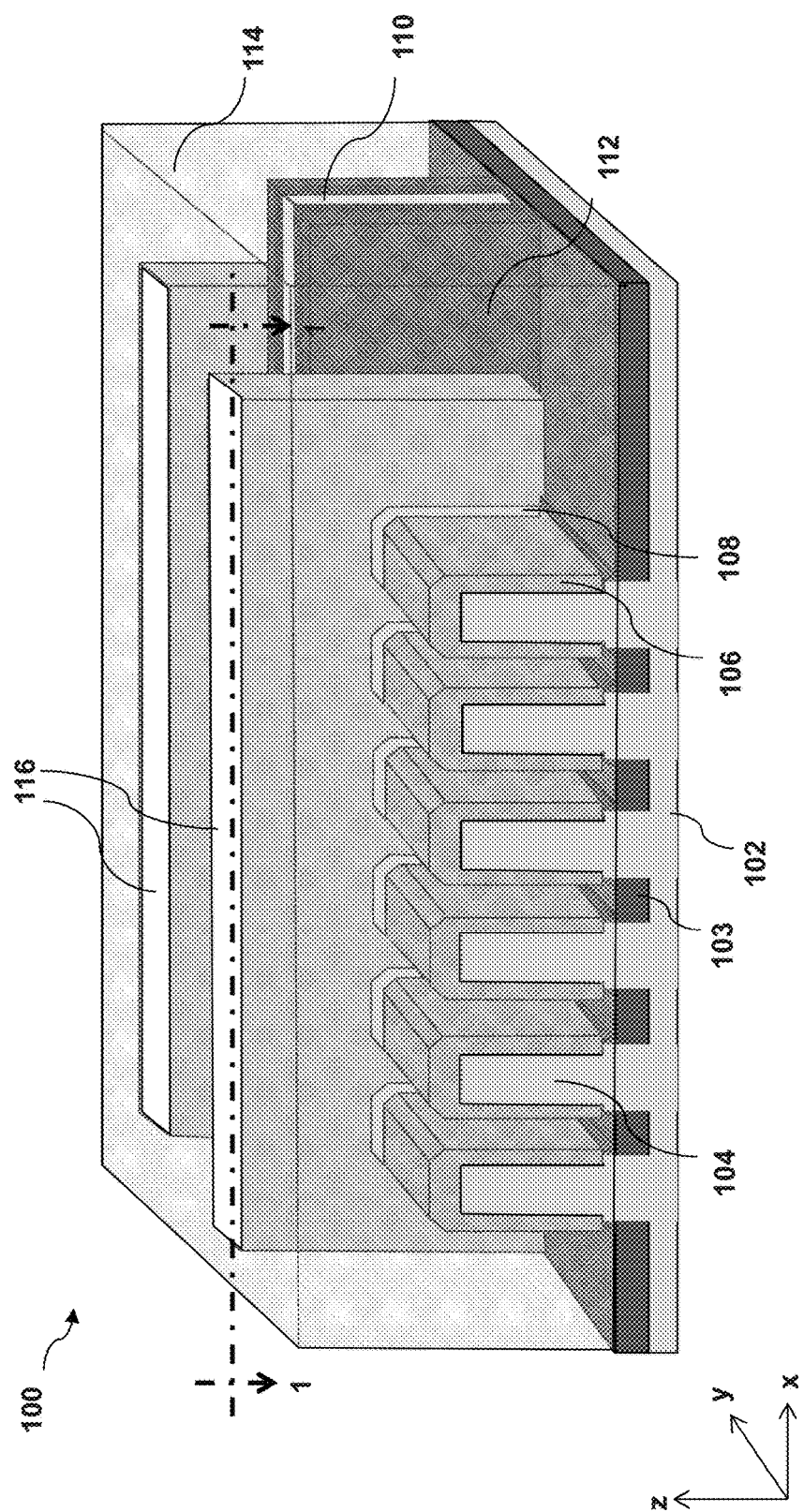
FIGS. 1A and 1B are perspective and cross-sectional views of a semiconductor device constructed according to various aspects of the present disclosure.

The following disclosure provides many different embodiments, or examples, for implementing different features of the provided subject matter. Specific examples of components and arrangements are described below to simplify the present disclosure. These are, of course, merely examples and are not intended to be limiting. For example, the formation of a first feature over or on a second feature in the description that follows may include embodiments in which the first and second features are formed in direct contact, and may also include embodiments in which additional features may be formed between the first and second features, such that the first and second features may not be in direct contact. In addition, the present disclosure may repeat reference numerals and/or letters in the various examples. This repetition is for the purpose of simplicity and clarity and does not in itself dictate a relationship between the various embodiments and/or configurations discussed.

Further, spatially relative terms, such as "beneath," "below," "lower," "above," "upper" and the like, may be used herein for ease of description to describe one element or feature's relationship to another element(s) or feature(s) as illustrated in the figures. The spatially relative terms are intended to encompass different orientations of the device in use or operation in addition to the orientation depicted in the figures. The apparatus may be otherwise oriented (rotated 90 degrees or at other orientations) and the spatially relative descriptors used herein may likewise be interpreted accordingly.

The present disclosure is generally related to semiconductor devices, and more particularly to semiconductor devices having multi-gate FETs that include conformal source and drain (S/D) contacts. Examples of the multi-gate FETs include double-gate FETs, triple-gate FETs, omega-gate FETs, and gate-all-around (GAA) FETs. Furthermore, the GAA FETs may include one or more of the nanowire channel, the bar-shaped channel, or other suitable channel structures. An object of the present disclosure is to provide a novel S/D contact structure for the multi-gate transistors so as to reduce the S/D contact resistance thereof. In embodiments, an interface between an S/D contact and an underlying semiconductor fin has a substantially conformal profile with respect to the shape of the underlying fin. In another word, the S/D contact effectively covers at least a top surface and two sidewall surfaces of the underlying fin. Such structure provides increased interface area between the S/D contact and the underlying fin, thereby reducing the S/D contact resistance compared to the conventional S/D contacts.

Figure 1B:
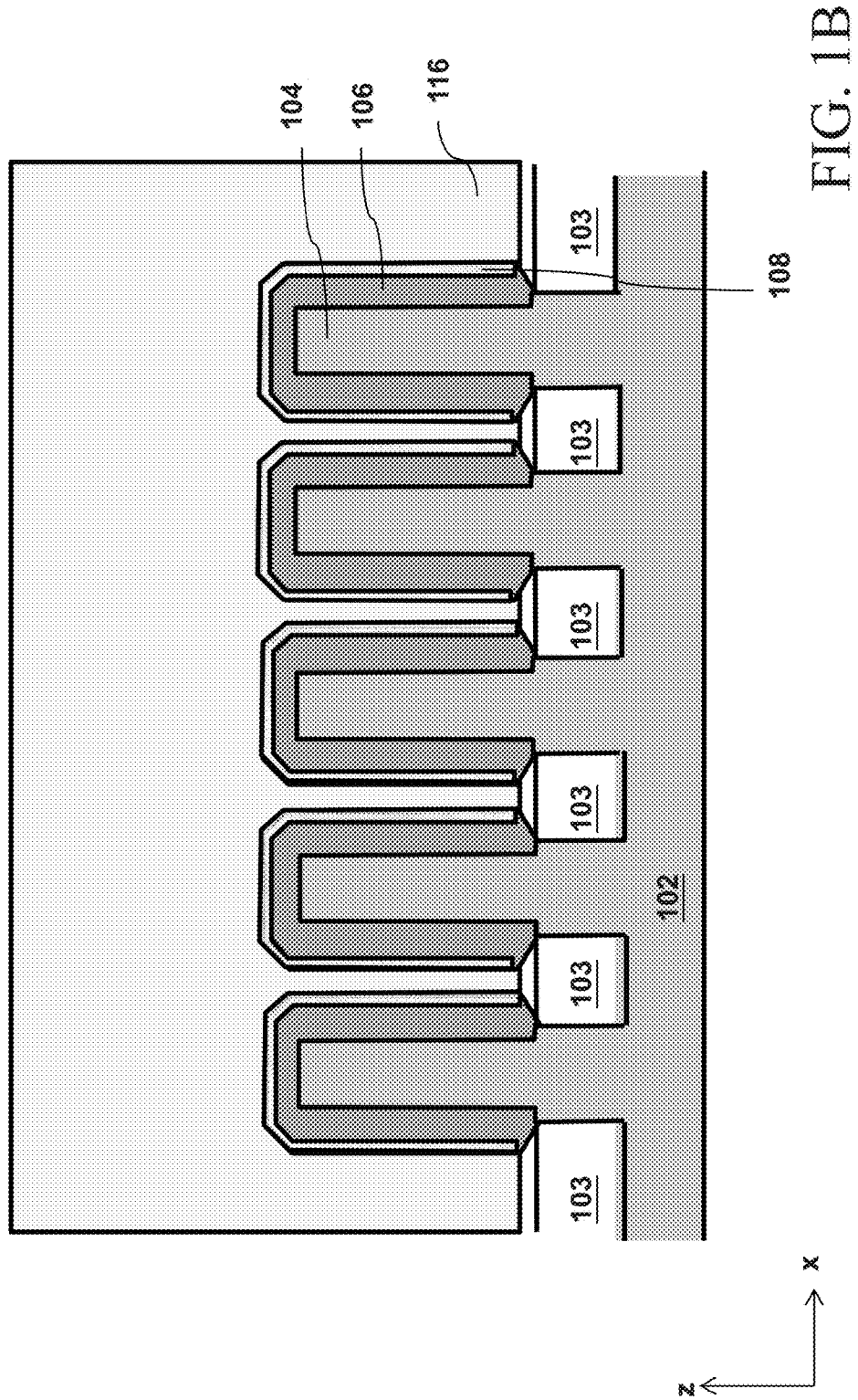

FIGS. 1A and 1B show a semiconductor device 100 having such a conformal S/D contact structure, constructed according to various aspects of the present disclosure. Particularly, FIG. 1A is a perspective view of the device 100 and FIG. 1B is a cross-sectional view of the device 100 along the "1-1" line of FIG. 1A.

As shown, the device 100 is a multi-gate FinFET device. Furthermore, the device 100 may be an intermediate device fabricated during processing of an integrated circuit (IC), or a portion thereof, that may comprise static random access memory (SRAM) and/or other logic circuits, passive components such as resistors, capacitors, and inductors, and active components such as p-type FETs, n-type FETs, metal-oxide semiconductor field effect transistors (MOSFET), complementary metal-oxide semiconductor (CMOS) transistors, bipolar transistors, high voltage transistors, high frequency transistors, other memory cells, and combinations thereof.

Referring to FIGS. 1A and 1B collectively, the device 100 includes a substrate 102, an isolation structure 103 over the substrate 102, and a plurality of fins 104 projecting upwardly (along the "z" direction) from the substrate 102 and above the isolation structure 103. The device 100 further includes a gate stack 110 and a gate spacer 112 on sidewalls of the gate stack 110. The gate stack 110 engages each of the fins 104 on three sides thereof, forming multiple gating surfaces (hence the term "multi-gate" device 100). Although FIGS. 1A and 1B show six fins in the device 100, this is not limiting. In embodiments, the device 100 may include one fin or any number of fins. The gate stack 110 engages the respective fins 104 at a channel region (not shown) of the device 100. The fins 104 further provide source and drain (S/D) regions of the device 100 on opposing sides of the gate stack 110. The device 100 further includes S/D contacts 116 that are operable to electrically communicate with the S/D regions in the fins 104.

The device 100 further includes a plurality of semiconductor films 106. Each of the films 106 covers the S/D regions of a respective fin 104. The films 106 are substantially conformal to the shape of the fins 104. The term "substantially conformal" as used herein means that a top surface of the films 106 is substantially parallel to a top surface of the fins 104, and sidewall surfaces of the films 106 are substantially parallel to sidewall surfaces of the fins 104. However, the thickness of the films 106 may or may not be uniform in various embodiments. In the present embodiment, the top surface of the films 106 and the top surface of the fins 104 are in the (100) crystal orientation (the "x-y" plane as illustrated), and the sidewall surfaces of the films 106 and the fins 104 are in the (110) crystal orientation. In alternative embodiments, the aforementioned surfaces may be in other crystal orientations. For example, the sidewall surfaces of the films 106 and the fins 104 may be in the (551) crystal orientation in another embodiment. In the present embodiment, the films 106 include a doped semiconductor material that provides a conductive path between the S/D contacts 116 and the S/D regions of the fins 104.

In the present embodiment, the device 100 further includes a conduction layer 108 between the S/D contacts 116 and the semiconductor films 106. In an embodiment, the conduction layer 108 is a metallization of a portion of the semiconductor films 106, such as by silicidation or germanosilicidation. In another embodiment, the conduction layer 108 is an ultrathin dielectric layer that helps reduce Fermi-level pinning effects between a metallic material (e.g., the S/D contacts 116) and a semiconductor material (e.g., the semiconductor films 106).

As can be seen in FIGS. 1A and 1B, the S/D contact structure of the device 100 includes multiple layers, one covering another with an inter-layer interface conforming to the shape of the fins 104. In the present embodiment, the semiconductor films 106 cover the respective fins 104, the conduction layer 108 covers the semiconductor films 106, and the S/D contacts 116 cover the conduction layer 108. Such conformal contact structure provides the maximum conducting interface area between the S/D contacts 116 and the fins 104, thereby reducing the S/D contact resistance. More details about the device 100, including the materials used for each of the features discussed above and the methods of forming the same, are described below.

Figure 2:
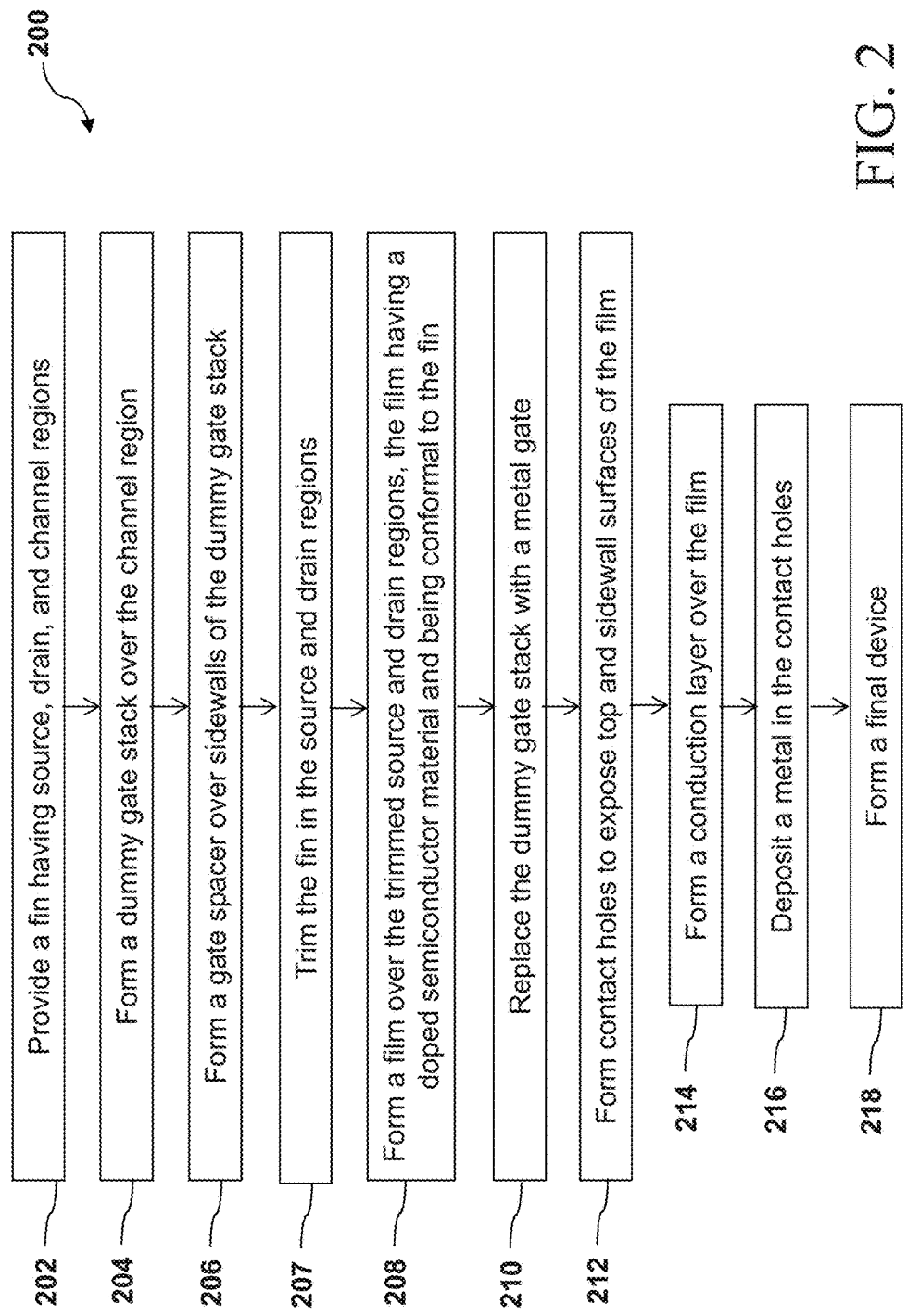
FIG. 2 shows a flow chart of a method of fabricating the semiconductor device of FIGS. 1A and 1B, according to some embodiments.

FIG. 2 shows a flow chart of a method 200 of forming a multi-gate semiconductor device having conformal S/D contacts, such as the semiconductor device 100, according to various aspects of the present disclosure. The method 200 is merely an example, and is not intended to limit the present disclosure beyond what is explicitly recited in the claims. Additional operations can be provided before, during, and after the method 200, and some operations described can be replaced, eliminated, or moved around for additional embodiments of the method.

Figure 3:
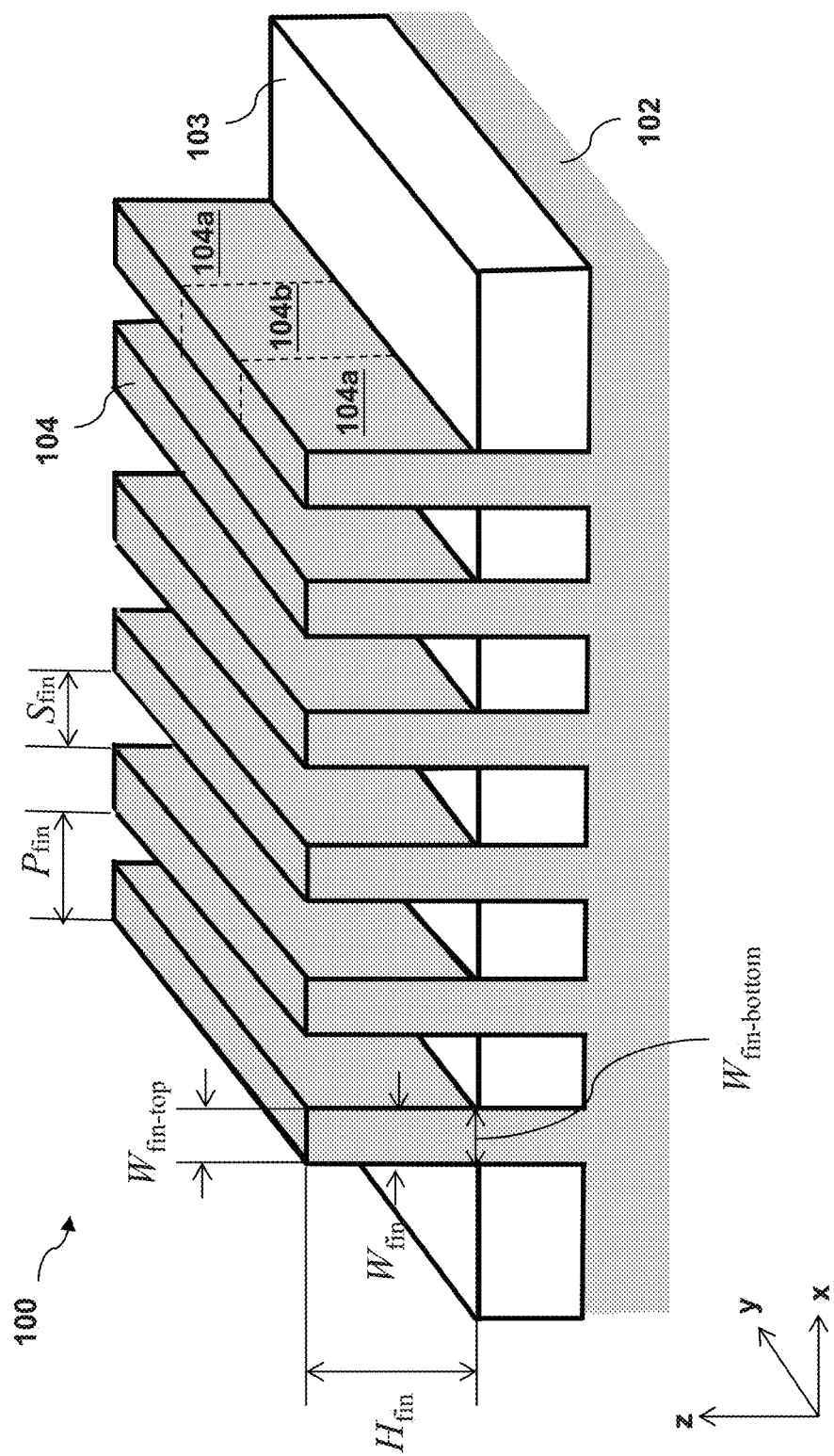
FIGS. 3, 4, 5, 6, 7A, 8, 9, and 10 are perspective views of forming a semiconductor device according to the method of FIG. 2, in accordance with some embodiments.

At operation 202, the method 200 (FIG. 2) receives a device 100 as shown in FIG. 3. Referring to FIG. 3, the device 100 includes a substrate 102 and a plurality of fins 104 projecting upwardly (along the "z" direction) from the substrate 102. The plurality of fins 104 are isolated by an isolation structure 103 that is disposed over the substrate 102.

The substrate 102 is a silicon substrate in the present embodiment. Alternatively, the substrate 102 may comprise another elementary semiconductor, such as germanium; a compound semiconductor including silicon carbide, gallium arsenic, gallium phosphide, indium phosphide, indium arsenide, and/or indium antimonide; an alloy semiconductor including SiGe, GaAsP, AlInAs, AlGaAs, GaInAs, GaInP, and/or GaInAsP; or combinations thereof.

The fins 104 may comprise at least a semiconductor material selected from the group consisting of silicon, silicon-germanium ($Si_{1-x}Ge_x$), germanium, and III-V compound semiconductors such as gallium arsenide, indium gallium arsenide ($In_mGa_{1-m}As$), indium arsenide, indium phosphide, and indium antimonide. The fins 104 may comprise strained $Si_{1-x}Ge_x$ formed on Si, or strained Si formed on relaxed silicon-germanium. In an embodiment, the fins 104 comprise strained $Si_{1-x}Ge_x$ and the substrate 102 comprises a relaxed or partially relaxed silicon germanium alloy $Si_{1-r}Ge_r$ layer, where the germanium mole fraction r is smaller than x. By selecting x to be larger than r, the natural lattice constant of the $Si_{1-x}Ge_x$ channel is larger than that of $Si_{1-r}Ge_r$, and the $Si_{1-x}Ge_x$ channel is under compressive stress or strain. In embodiments, the compressive strain in the channel in the longitudinal direction is larger than 0.5%, such as larger than 1%. In embodiments, the substrate 102 may also comprise a silicon oxide ($SiO_2$) layer (i.e. silicon-on-insulator substrate), and the fins 104 may be formed from a silicon-on-insulator wafer.

Still referring to FIG. 3, although labeled on only one fin, each of the fins 104 (or simply the fin 104) includes two source/drain (S/D) regions 104a and a channel region 104b between the two S/D regions 104a. The S/D regions 104a and the channel region 104b are arranged horizontally along the "y" direction. In the present embodiment, the fin 104 has a rectangular or trapezoidal profile in the "x-z" plane.

The widths of the fin 104 at its top, central, and bottom (right above the isolation structure 103) portions along the "x" direction are $W_{fin-top}$, $W_{fin}$, and $W_{fin-bottom}$ respectively. The fin 104 has a height $H_{fin}$ above the isolation structure 103 along the "z" direction. The plurality of fins 104 are spaced from each other along the "x" direction with a spacing $S_{fin}$ and an edge-to-edge pitch $P_{fin}$. In embodiments, the fin widths $W_{fin-top}$ and $W_{fin-bottom}$ may be 10 nanometers (nm) or smaller, such as 8 nm or smaller. In embodiments, $W_{fin-top}$ may be equal to or smaller than $W_{fin}$ which in turn may be equal to or smaller than $W_{fin-bottom}$. In embodiments, the fin height $H_{fin}$ may be equal to or greater than 30 nm, such as 40 nm or greater, or even 50 nm or greater. In embodiments, the fin pitch $P_{fin}$ may be 30 nm or smaller. In the present embodiment, the fin sidewall surfaces are of (110) crystal orientation and the fin top surface is of (100) crystal orientation. The fin sidewall surfaces may be of other crystal orientations such as (551). Other configurations and shapes of the fins 104 are possible and are within the scope of the present disclosure.

In embodiments, where the fins 104 comprise Si fins and $Si_{1-x}Ge_x$ fins, $Si_{1-x}Ge_x$ fins may be formed together with Si fins and $Si_{1-x}Ge_x$ fins may be adjacent to Si fins. Further, $Si_{1-x}Ge_x$ fins and Si fins need not have the same physical dimensions of $H_{fin}$, $W_{fin-top}$, and $W_{fin-bottom}$. The $Si_{1-x}Ge_x$ fins may be used for p-channel transistors, while the Si fins may be used for n-channel transistors. In embodiments, as the Si fins 104 are formed on a fully or partially relaxed $Si_{1-r}Ge_r$ layer in the substrate 102, the Si fins would be under tensile stress or strain in the longitudinal direction. The presence of tensile strain in the longitudinal direction increases the electron mobility in Si, and improves the drive current and speed performance of the n-channel Si transistors.

The fins 104 may be fabricated using suitable processes including photolithography and etching processes. The photolithography process may include forming a photoresist layer (resist) overlying the substrate 102, exposing the resist to a pattern, performing post-exposure bake processes, and developing the resist to form a masking element including the resist. The masking element is then used for etching recesses into the substrate 102, leaving the fins 104 on the substrate 102. The etching process can include dry etching, wet etching, reactive ion etching (RIE), and/or other suitable processes. Alternatively, the fins 104 may be formed using mandrel-spacer double patterning lithography. Numerous other embodiments of methods to form the fins 104 may be suitable.

The isolation structure 103 may be formed of silicon oxide, silicon nitride, silicon oxynitride, fluoride-doped silicate glass (FSG), a low-k dielectric material, and/or other suitable insulating material. The isolation structure 103 may be shallow trench isolation (STI) features. In an embodiment, the isolation structures 103 is formed by etching trenches in the substrate 102, e.g., as part of the fins 104 formation process. The trenches may then be filled with isolating material, followed by a chemical mechanical planarization (CMP) process. Other isolation structure such as field oxide, LOCal Oxidation of Silicon (LOCOS), and/or other suitable structures are possible. The isolation structure 103 may include a multi-layer structure, for example, having one or more thermal oxide liner layers.

Figure 4:
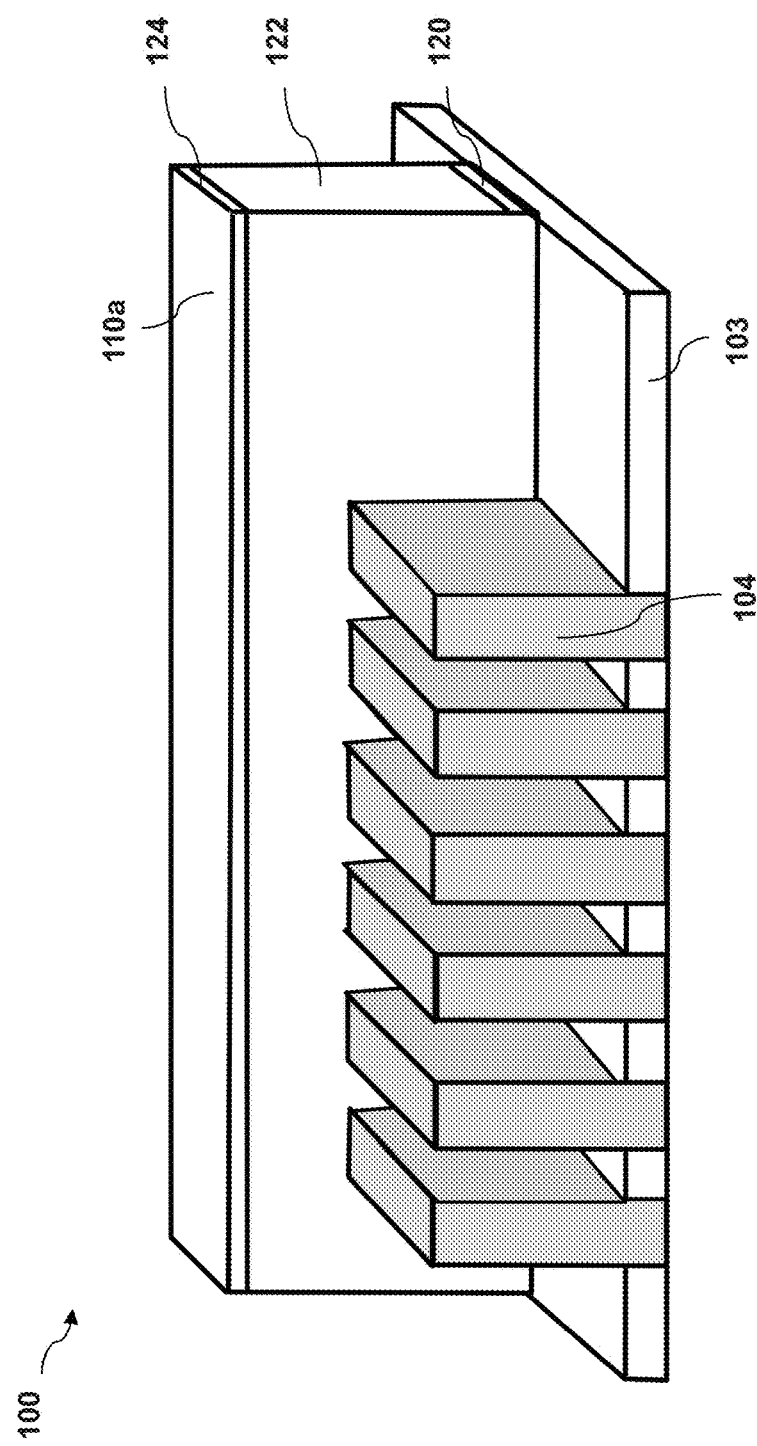

At operation 204, the method 200 (FIG. 2) forms a gate stack 110a over the fins 104, particularly, over the channel regions 104b. In the present embodiment, the gate stack 110a is a placeholder and will be replaced by a final gate stack in a gate-last process. Therefore, the gate stack 110a is also referred to as a dummy gate stack 110a. In alternative embodiments, the gate stack 110a is the final gate stack, e.g., in a gate-first process. Referring to FIG. 4, the dummy gate stack 110a includes a dummy interfacial layer 120, a dummy gate electrode 122, and a hard mask layer 124. The dummy interfacial layer 120 may include a dielectric material such as silicon oxide layer (e.g., $SiO_2$) or silicon oxynitride (e.g., SiON), and may be formed by chemical oxidation, thermal oxidation, atomic layer deposition (ALD), chemical vapor deposition (CVD), and/or other suitable methods. The dummy gate electrode 122 may include poly-crystalline silicon (poly-Si) and may be formed by suitable deposition processes such as low-pressure chemical vapor deposition (LPCVD) and plasma-enhanced CVD (PECVD). The hard mask layer 124 may include one or more layers of material such as silicon oxide and/or silicon nitride. In embodiments, the dummy gate stack 110a may include other suitable layers. The various layers of the dummy gate stack 110a may be formed by photolithography and etching processes.

At operation 206, the method 200 (FIG. 2) forms a gate spacer 112 over sidewalls of the dummy gate stack 110a. This may involve one or more deposition and etching processes. In an embodiment, a spacer is formed on the sidewalls of both the dummy gate stack 110a and the fins 104, and then it is removed from the sidewalls of the fins 104, leaving only the portion on the sidewalls of the dummy gate stack 110a. This is illustrated in FIGS. 5 and 6.

Figure 5:
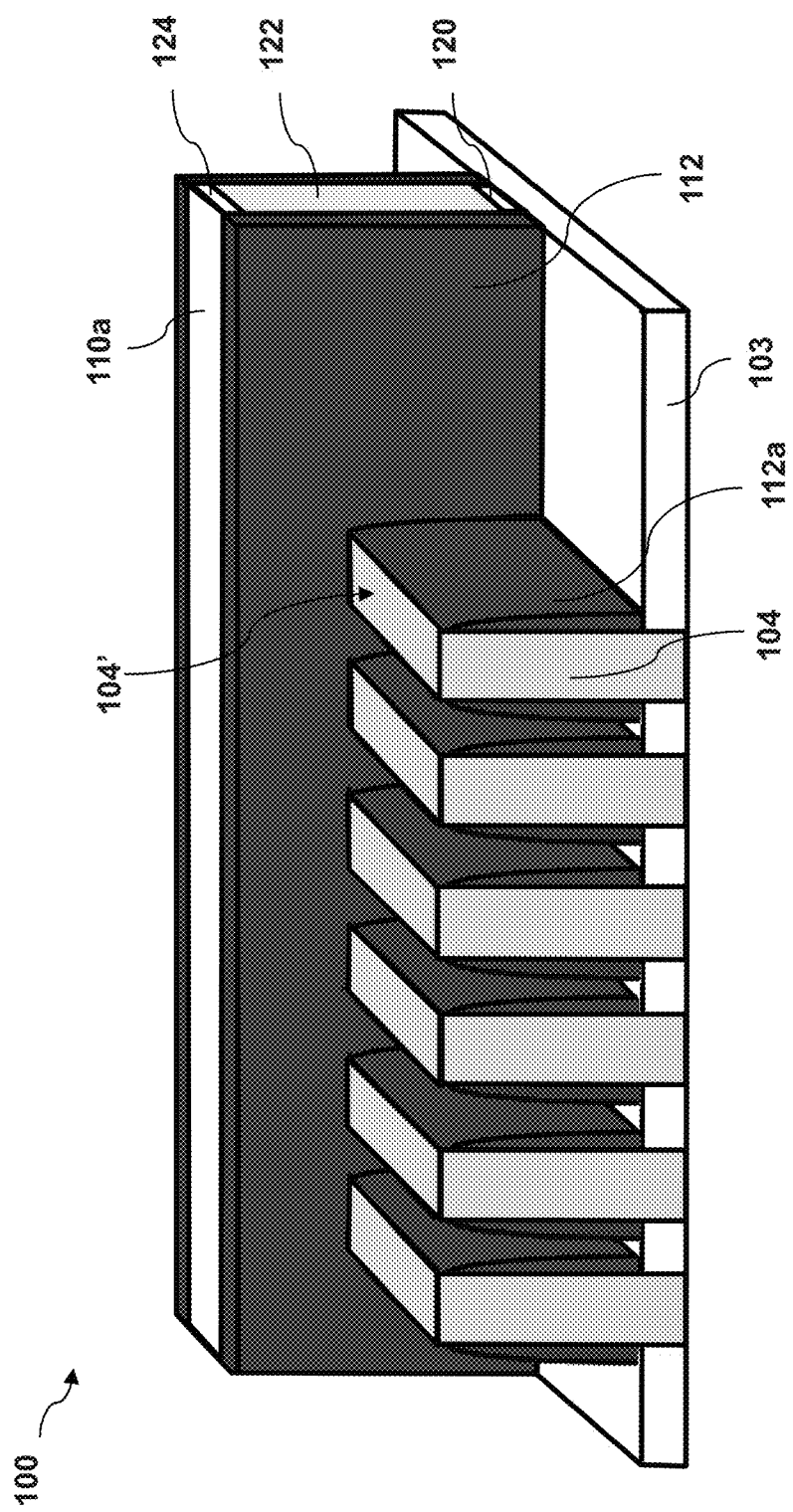

Referring to FIG. 5, in an embodiment, a spacer material is deposited as a blanket over the isolation structure 103, the fins 104, and the dummy gate stack 110a. Then the spacer material is etched by an anisotropic etching process to expose the isolation structure 103, the hard mask layer 124, and a top surface 104' of the fins 104. As a result, only portions of the spacer material on the sidewalls of the dummy gate stack 110a and the sidewalls of the fins 104 remain. The portion of the spacer material on the sidewalls of the dummy gate stack 110a is referred to as the gate spacer 112, while the portion of the spacer material on the sidewalls of the fins 104 is referred to as the fin spacer 112a. In embodiments, the spacer material may comprise a dielectric material, such as silicon oxide, silicon nitride, silicon oxynitride, silicon carbide, other dielectric material, or combinations thereof. Furthermore, the gate spacer 112 and the fin spacer 112a may comprise one or multiple layers of material.

Figure 6:
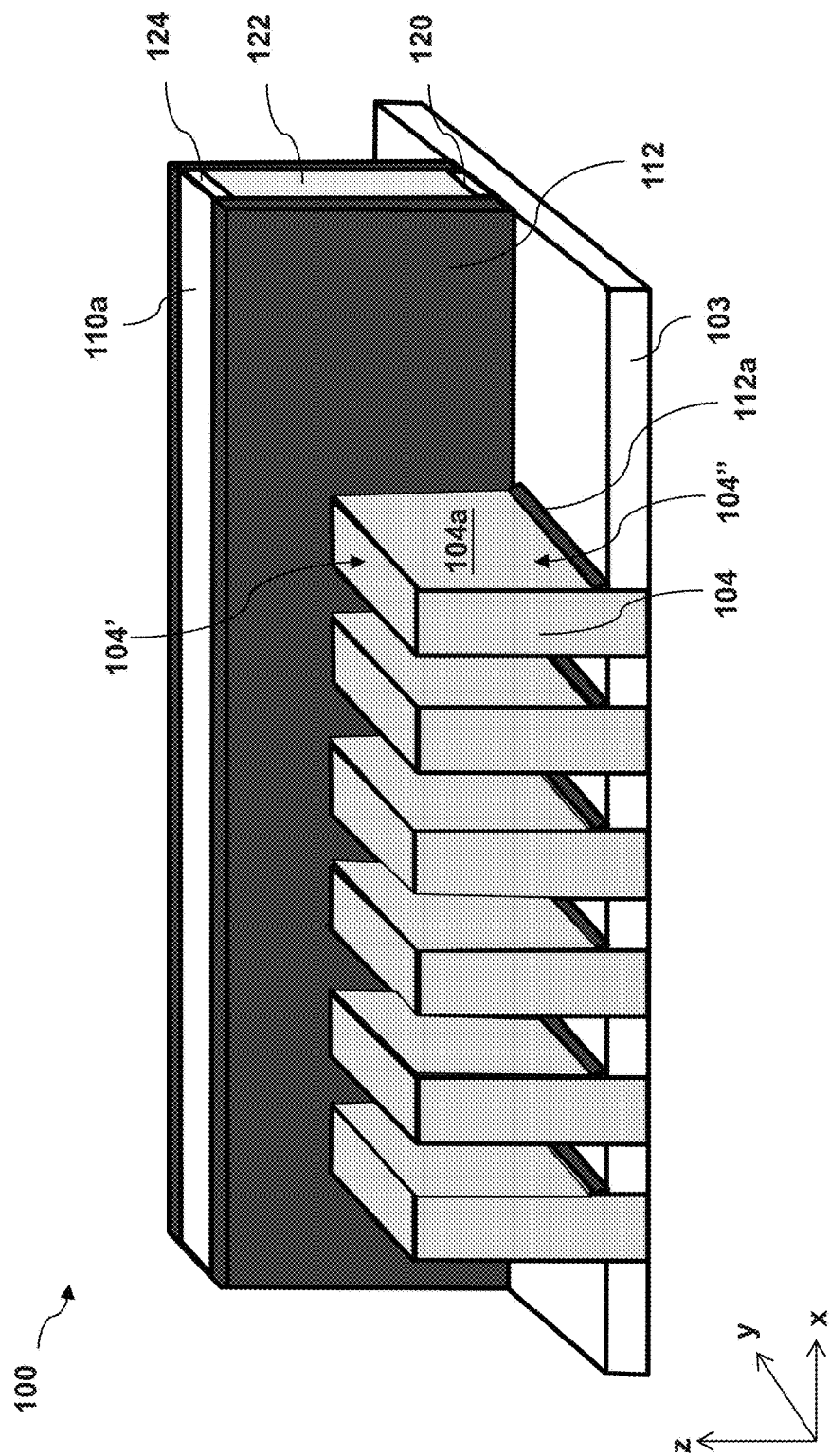

Referring to FIG. 6, the fin spacer 112a is substantially removed while the gate spacer 112 remains. In an embodiment, this is achieved by one or more treatment and etching processes. In a first step of this embodiment, the gate spacer 112 is selectively modified to have a different etch resistance than that of the fin spacer 112a. For example, this can be done by a directional ion implantation (e.g. oxygen implant) or plasma treatment in the presence of a directional ion beam so that the gate spacer 112 is more resistant to an etchant than the fin spacer 112a. In a second step of this embodiment, the fin spacer 112a is substantially removed by a selective etching process while the gate spacer 112 substantially remains. As shown in FIG. 6, the etching process exposes the sidewall surfaces 104" of the fins 104. Also shown in FIG. 6, a small portion of the fin spacer 112a remains at the feet of the fins 104. In alternative embodiments, the fin spacer 112a may be completely removed. In embodiments, operation 206 further includes a cleaning process that cleans the surfaces of the fins 104 including the surfaces 104' and 104" and prepares them for a subsequent epitaxial growth process. The various etching and cleaning processes above may recess the fins 104 slightly.

Figure 7A:
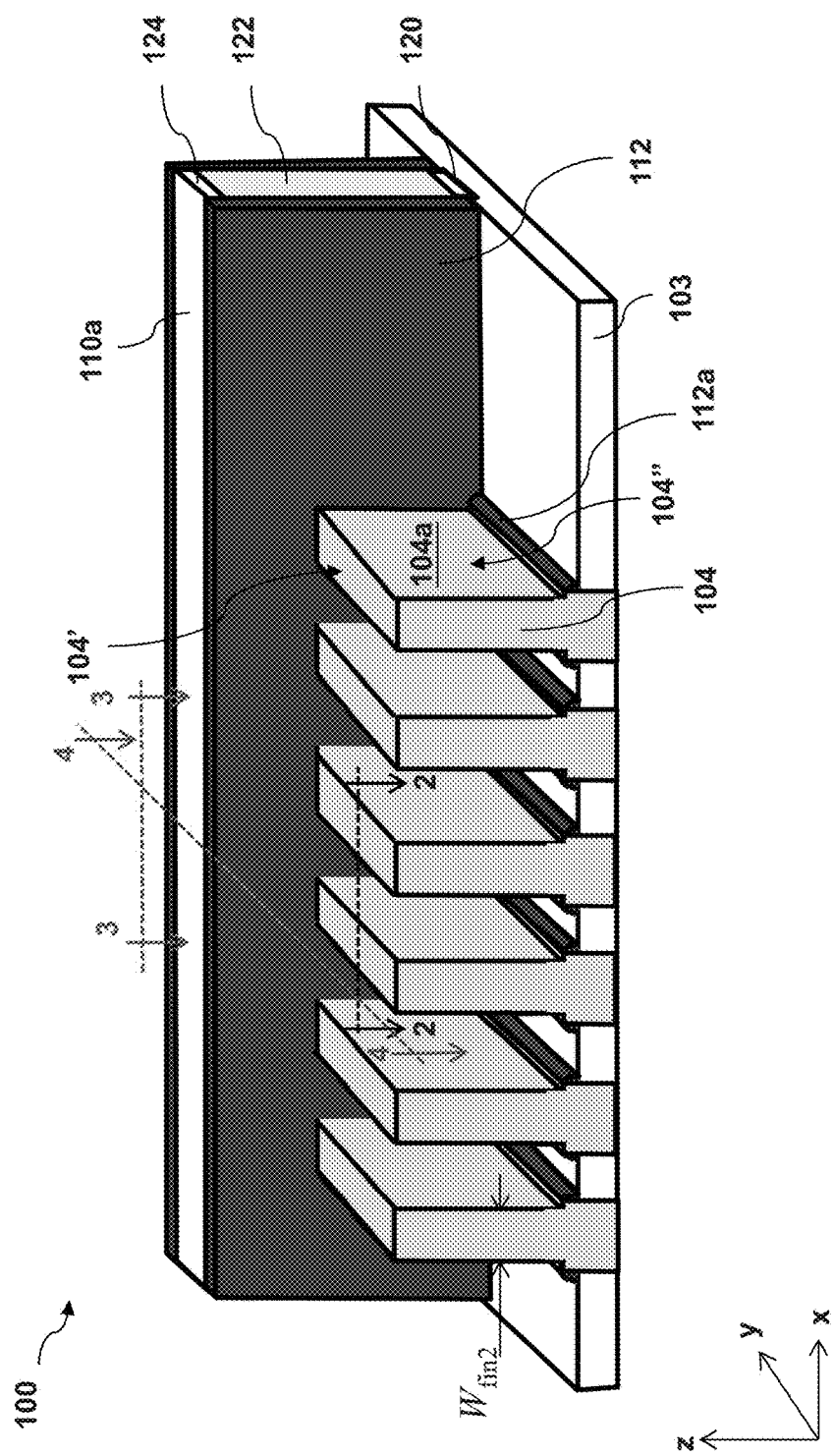
Figure 7B:
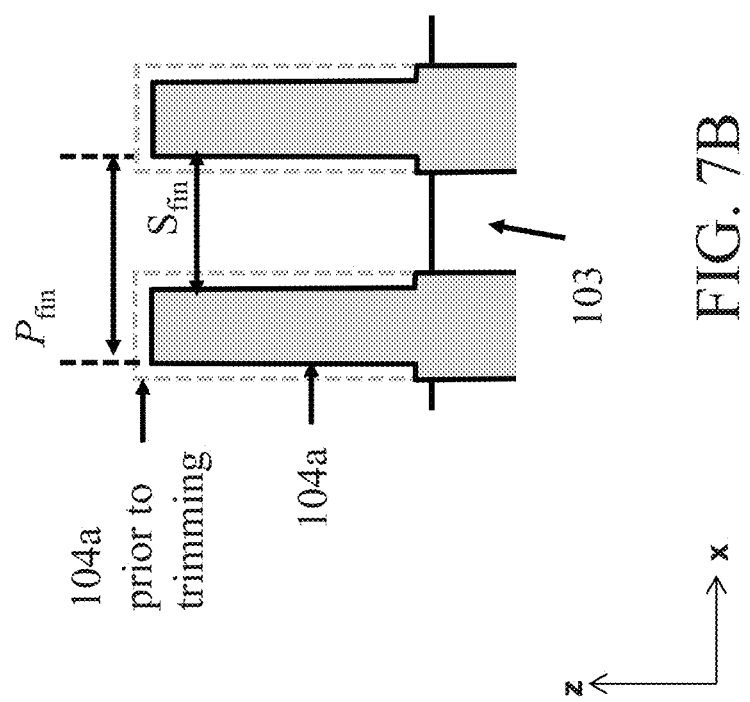

At operation 207, the method 200 (FIG. 2) trims the fins 104 in the source and drain regions 104a. The trimming increases the lateral spacing $S_{fin}$ along the "x" direction, providing benefits for subsequent fabrication stages. The device 100 post the operation 207 is shown in FIGS. 7A, 7B, 7C, and 7D collectively. FIG. 7B is a cross-sectional view of the trimmed source/drain regions 104a along the "2-2" line of FIG. 7A. FIG. 7C is a cross-sectional view of the channel region 104b along the "3-3" line of FIG. 7A superimposed with the cross-sectional view of the source/drain regions 104a of FIG. 7B. FIG. 7D is a cross-sectional view of the fin 104 along the "4-4" line of FIG. 7A. Referring to FIG. 7A, the fins 104 are trimmed to have a new central width $W_{fin2}$ that is smaller than $W_{fin}$ (FIG. 3). In embodiments, the reduction in the fin width may be between 0.5 nm to 10 nm depending on the width of the fins 104. In the present embodiment, the reduction in the fin width is about 5 nm or less, such as about 3 nm or less. Referring to FIG. 7B, the top and bottom widths of the fins 104 are reduced accordingly. The lateral spacing $S_{fin}$ between two adjacent fins are thereby increased by ($W_{fin} - W_{fin2}$). This increase is desirable for at least two reasons. First, it creates more room for the subsequent epitaxial growth process. Without the trimming of the fins 104, epitaxial growth off of the fins 104 might merge, resulting in reduced S/D contact area. Second, if there is not enough spacing between the fins 104 after the subsequent epitaxial growth, it will be difficult for depositing S/D contact material to fully wrap around the fins 104. The height of the fin $H_{fin}$ may be reduced slightly by the trimming process. The new top and sidewall surfaces of the fins 104 are still labeled as 104' and 104" (FIG. 7A) respectively for the sake of convenience. Since the channel regions 104b are covered by the dummy gate stack 110a, they are not trimmed by this process. Referring to FIGS. 7C and 7D, as a result of the operation 207, the width of the S/D regions 104a ($W_{fin2}$) is now smaller than the width of the channel regions 104b ($W_{fin}$) and the height of the S/D regions 104a ($H_{fin2}$.) is now smaller than the height ($H_{fin}$) of the channel regions 104b. In embodiments, the operation 207 may include a wet etch in solution, reactive ion etch (RIE) in low density plasma, single-step etch at cryogenic conditions in inductively coupled plasma (ICP) combined with RIE, time-multiplexed deep silicon etch in ICP-RIE configuration reactor, single-step etch in high density plasma at room or near room temperature, or other etching methods suitable for the material of the fins 104.

Figure 8:
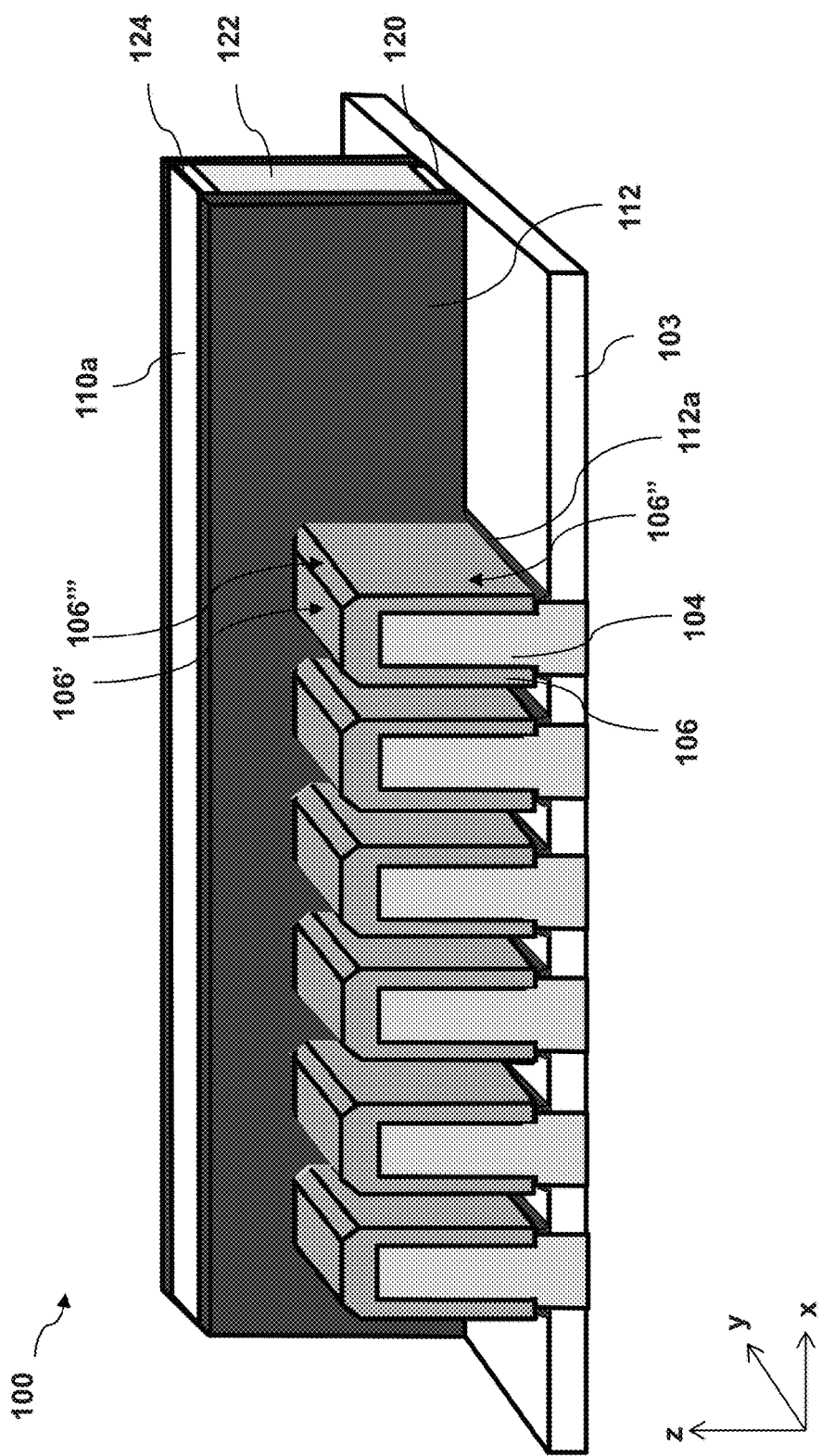

At operation 208, the method 200 (FIG. 2) forms a doped semiconductor film (or films) 106 over the fins 104. Referring to FIG. 8, the film 106 is formed to cover the S/D regions 104a. Further, the film 106 has a substantially conformal profile with respect to the fins 104, with its top surface 106' substantially parallel to the fin top surface 104' and its sidewall surfaces 106" substantially parallel to the fin sidewall surface 104". In an embodiment, each of the sidewall surfaces 106" is substantially perpendicular to the top surface 106'. In the present embodiment, the sidewall surfaces 106" do not meet the top surface 106' directly. Rather, they are connected through a respective intermediate surface 106''' of the film 106. In an alternative embodiment, the sidewall surfaces 106" meet the top surface 106' directly to form edges there between. In embodiments, the film 106 is about few nanometers thick, such as from about 1 nm to about 5 nm.

In embodiments, the film 106 is a heavily doped and epitaxially grown semiconductor film. In some embodiments, the device 100 is a p-channel multi-gate FET, the fins 104 includes Si or $Si_{1-x}Ge_x$, and the film 106 may be boron-doped $Si_{1-y}Ge_y$, where y is equal to or larger than x to induce longitudinal compressive strain in the channel for hole mobility enhancement. In some embodiments, the device 100 is an n-channel multi-gate FET, the fins 104 includes Si, and the film 106 may be phosphorus-doped silicon (Si:P) or phosphorus-doped silicon-carbon ($Si_{1-z}C_z$:P). In embodiments, where the fins 104 include a compound semiconductor such as $In_mGa_{1-m}As$, the doped epitaxial film 106 may be $In_nGa_{1-n}As$, where n is smaller than or equal to m. In embodiments, where the device 100 includes both p-channel and n-channel FETs, the doped semiconductor films 106 may be formed separately in the p-channel and n-channel device regions. For example, an n-type film 106 is formed first with the p-channel device regions covered by a hard mask, and then a p-type film 106 is formed with the n-channel device regions covered by a hard mask.

In an embodiment, the semiconductor film 106 is formed by one or more selective epitaxy growth (SEG) processes. In one example, the SEG process is a low pressure chemical vapor deposition (LPCVD) process using a silicon-based precursor gas. To further this embodiment, the growth of different facets of the semiconductor film 106 is controlled so as to achieve a desired profile as shown in FIG. 8. In the present embodiment, the fin surfaces 104' and 104" are pre-processed to be in the (100) and (110) crystal orientations, respectively. The growth of the semiconductor films 106 then follows the respective crystal direction, i.e. growing in the [100] and [110] directions to form the top surface 106' and sidewall surfaces 106". This results in the top surface 106' in the (100) facet, the sidewall surfaces 106" in the (110) facet, and the intermediate surfaces 106''' in the (111) facet. In various embodiments, the fin surfaces 104' and 104" are pre-processed to be substantially of the (100) and (110) crystal orientations, i.e., they are within ±10 degrees of the (100) and (110) crystal orientations, respectively. To further these embodiments, the epitaxial growth follows the respective crystal direction of the fin surfaces and the resulting semiconductor films 106 have the top surface 106' substantially in the (100) facet, the sidewall surfaces 106" substantially in the (110) facet, and the intermediate surfaces 106''' substantially in the (111) facet. In a further embodiment, the growth of the semiconductor films 106 are controlled so that there is enough spacing between the films 106 on adjacent fins 104 for subsequent fabrication steps, such as depositing a metal in between the films 106.

In embodiments, the operation 208 in-situ dopes the grown semiconductor with an n-type dopant such as phosphorus, or arsenic, or combinations thereof for forming the doped silicon film 106 for n-type devices. In embodiments, the operation 208 in-situ dopes the grown semiconductor with a p-type dopant such as boron or indium for forming the doped SiGe film 106 for p-type devices. In embodiments, an optional thermal treatment may be performed to enhance the dopant activation in the film 106, e.g. using rapid thermal annealing (RTA), millisecond anneal (MSA) or spike anneal, laser annealing (LSA), or other annealing techniques.

At operation 210, the method 200 (FIG. 2) replaces the dummy gate stack 110a with a final gate stack 110 using a gate-last process (also called a replacement gate process). However, when operation 204 forms a final gate stack instead of a dummy gate stack, operation 210 may be bypassed. In embodiments, operation 210 involves multiple steps as discussed below with reference to FIGS. 9 and 10.

Figure 9:
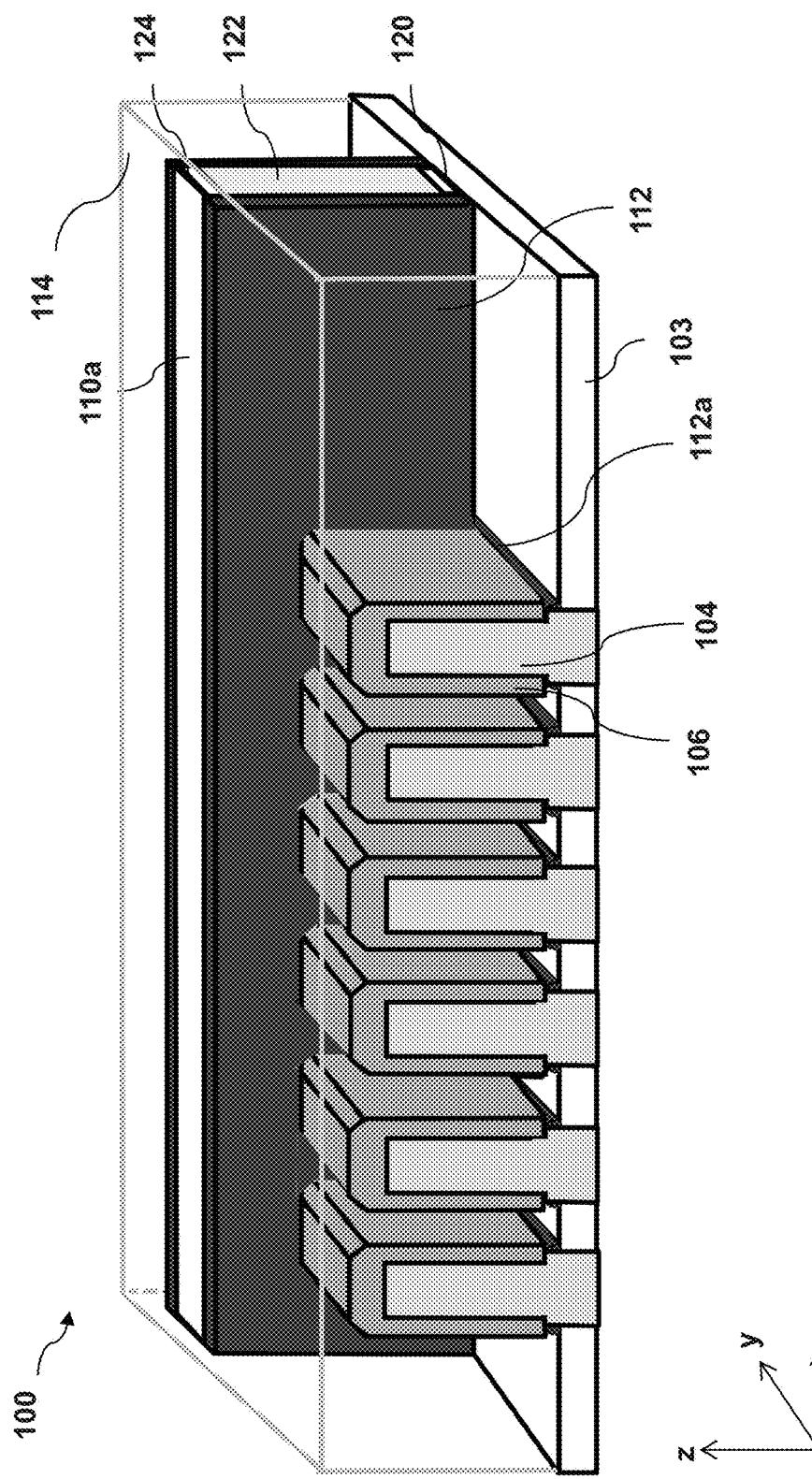

Referring to FIG. 9, in a first step, a dielectric material layer 114 is deposited over the isolation structure 103, the film 106, and the dummy gate stack 110a. The dielectric material layer 114 is also referred to as inter-layer dielectric (ILD) layer 114. In embodiments, a contact etch stop layer (CESL) may be formed underneath the ILD layer 114. The CESL may include silicon nitride, silicon oxynitride, silicon nitride with oxygen (O) or carbon (C) elements, and/or other materials. In one example, the CESL includes silicon nitride ($Si_3N_4$) having an intrinsic stress with a magnitude of 1 GPa or higher. The intrinsic stress is compressive for p-channel devices and tensile for n-channel devices. The ILD layer 114 may include materials such as tetraethylorthosilicate (TEOS) oxide, un-doped silicate glass, or doped silicon oxide such as borophosphosilicate glass (BPSG), fused silica glass (FSG), phosphosilicate glass (PSG), boron doped silicon glass (BSG), and/or other suitable dielectric materials. The ILD layer 114 may be deposited by a PECVD process or other suitable deposition technique. In an embodiment, the ILD layer 114 is formed by a flowable CVD (FCVD) process. The FCVD process includes depositing a flowable material (such as a liquid compound) over the substrate 102 to fill various trenches, and converting the flowable material to a solid material by a suitable technique, such as thermal annealing or ultra-violet radiation. The ILD layer 114 is then etched back or planarized by a CMP process to expose the hard mask layer 124.

Figure 10:
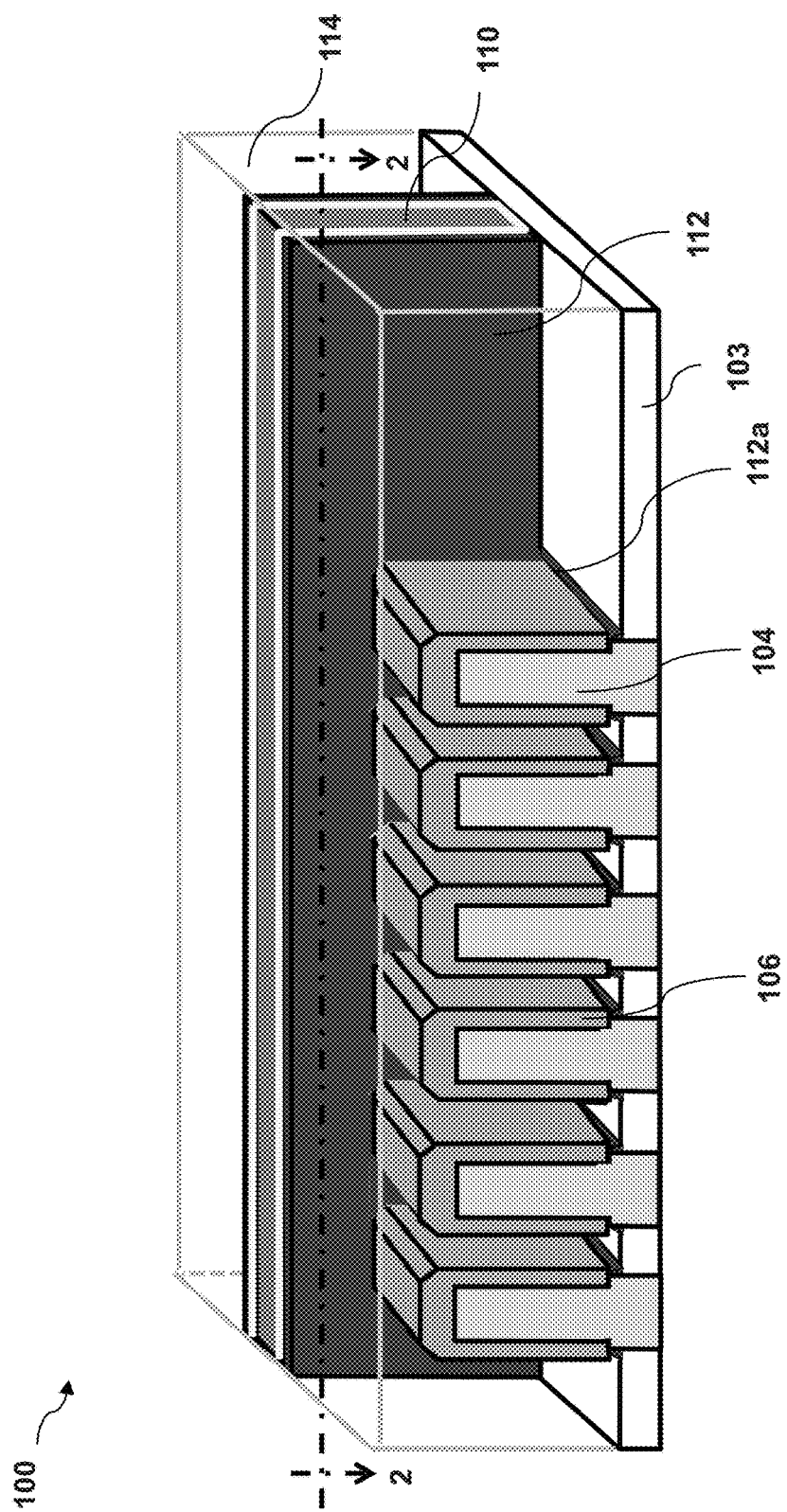

Referring to FIG. 10, in a second step, the hard mask layer 124, the dummy electrode 122, and the dummy interfacial layer 120 are removed in one or more etching processes, thereby forming a recess between two sidewalls of the gate spacer 112. The various layers may be removed with a suitable wet etch, dry (plasma) etch, and/or other processes. Subsequently, one or more material layers are deposited into the recess to form the final gate stack 110. In one example, the gate stack 110 includes an interfacial layer, a gate dielectric layer, a work function metal layer, and a metal fill layer. The interfacial layer may include a dielectric material such as silicon oxide layer ($SiO_2$) or silicon oxynitride (SiON), and may be formed by chemical oxidation, thermal oxidation, atomic layer deposition (ALD), CVD, and/or other suitable dielectric. The interfacial layer is less than 1 nm thick in various embodiments. The gate dielectric layer may include a high-k dielectric layer such as hafnium oxide ($HfO_2$), zirconium oxide ($ZrO_2$), lanthanum oxide ($La_2O_3$), titanium oxide ($TiO_2$), yttrium oxide ($Y_2O_3$), strontium titanate ($SrTiO_3$), other suitable metal-oxides, or combinations thereof. The gate dielectric layer may be formed by ALD and/or other suitable methods and may have a thickness ranging from about 1.0 nm to about 10 nm. The work function metal layer may be a p-type or an n-type work function layer. The p-type work function layer comprises a metal with a sufficiently large effective work function, selected from but not restricted to the group of titanium nitride (TiN), tantalum nitride (TaN), ruthenium (Ru), molybdenum (Mo), tungsten (W), platinum (Pt), or combinations thereof. The n-type work function layer comprises a metal with sufficiently low effective work function, selected from but not restricted to the group of titanium (Ti), aluminum (Al), tantalum carbide (TaC), tantalum carbide nitride (TaCN), tantalum silicon nitride (TaSiN), or combinations thereof. The work function metal layer may include a plurality of layers and may be deposited by CVD, PVD, and/or other suitable process. The metal fill layer may include aluminum (Al), tungsten (W), cobalt (Co), copper (Cu), and/or other suitable materials. The metal fill layer may be formed by CVD, PVD, plating, and/or other suitable processes.

Figure 11:
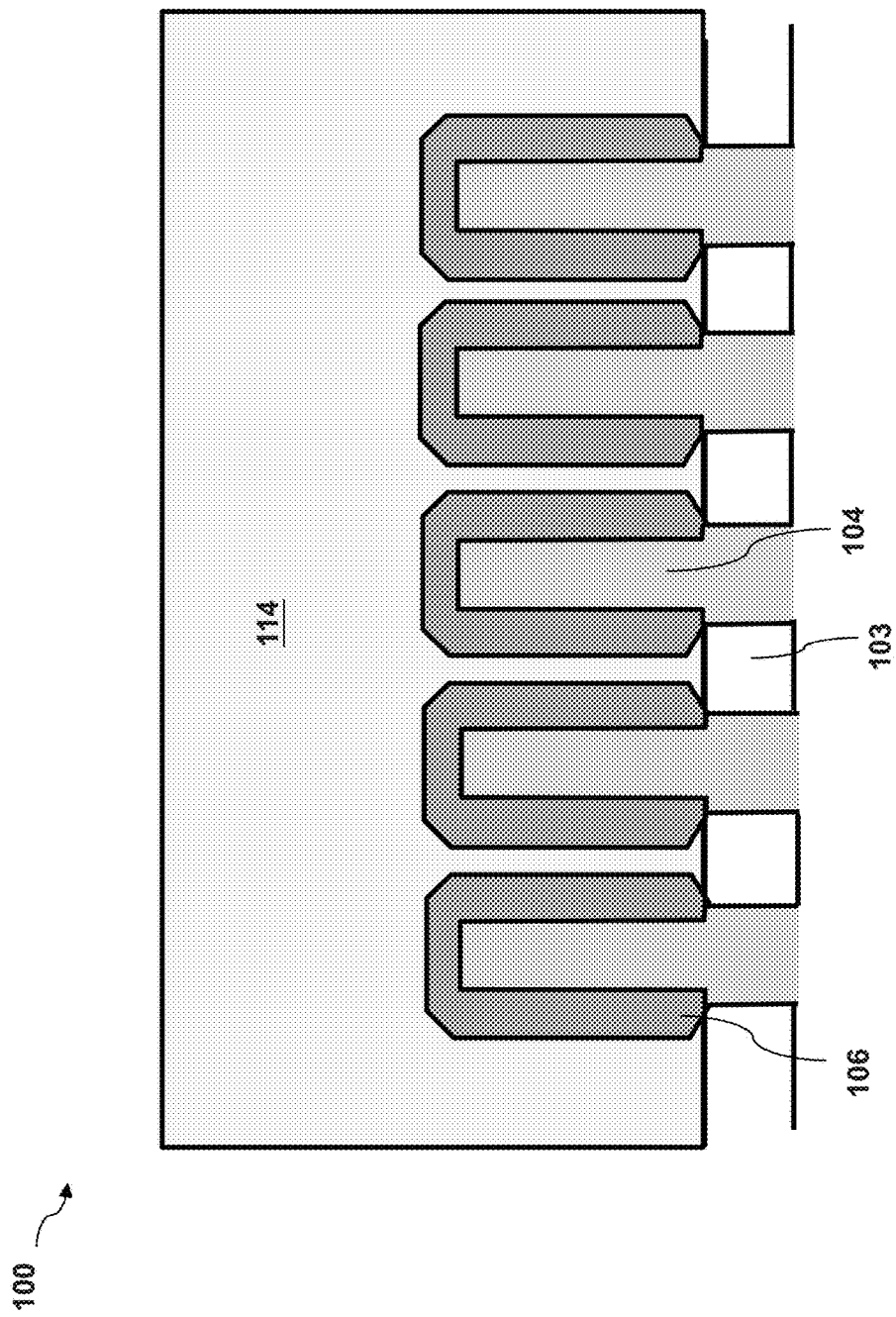
FIGS. 11, 12, 13, and 14 are cross-sectional views of forming a semiconductor device according to the method of FIG. 2, in accordance with some embodiments.
Figure 12:
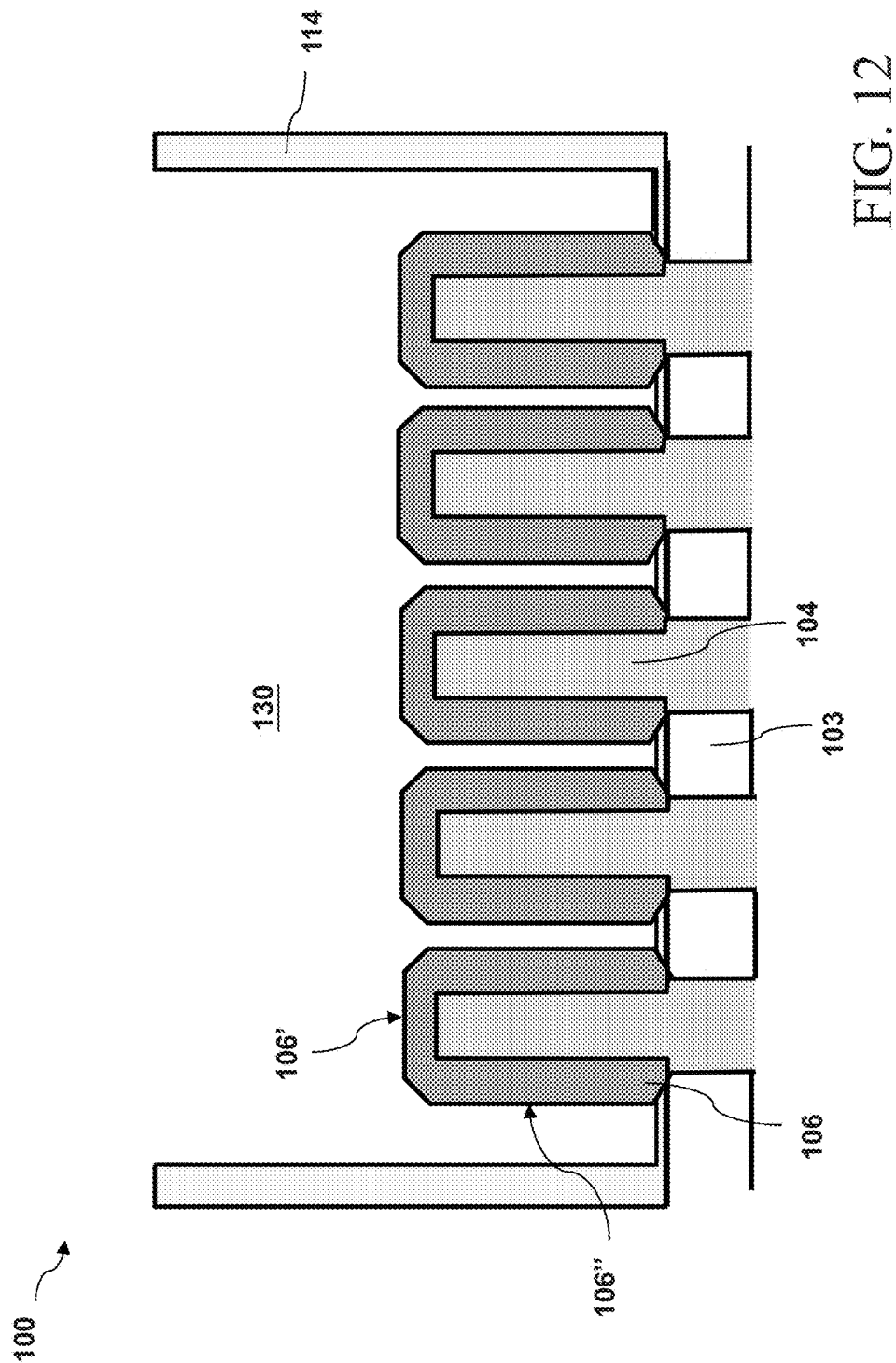

At operation 212, the method 200 (FIG. 2) forms contact holes 130 in the S/D regions to expose a portion of the top and sidewall surfaces of the film 106. This is illustrated in FIGS. 11 and 12, which are cross-sectional views of the device 100 along the "2-2" line of FIG. 10, showing the device 100 before and after the contact holes 130 are formed, respectively. In embodiments, the contact holes 130 are formed by one or more photolithography and etching processes. The photolithography process may form a hard mask over the device 100, having openings through which the contact holes 130 are etched. The etching process may include a suitable wet etch, dry (plasma) etch, and/or other processes. For example, a dry etching process may use chlorine-containing gases, fluorine-containing gases, other etching gases, or a combination thereof. The wet etching solutions may include $NH_4OH$, HF (hydrofluoric acid) or diluted HF, deionized water, TMAH (tetramethylammonium hydroxide), other suitable wet etching solutions, or combinations thereof. As shown in FIG. 12, the contact holes 130 expose a portion of the top surfaces 106' and the sidewall surfaces 106" of the films 106.

Figure 13:
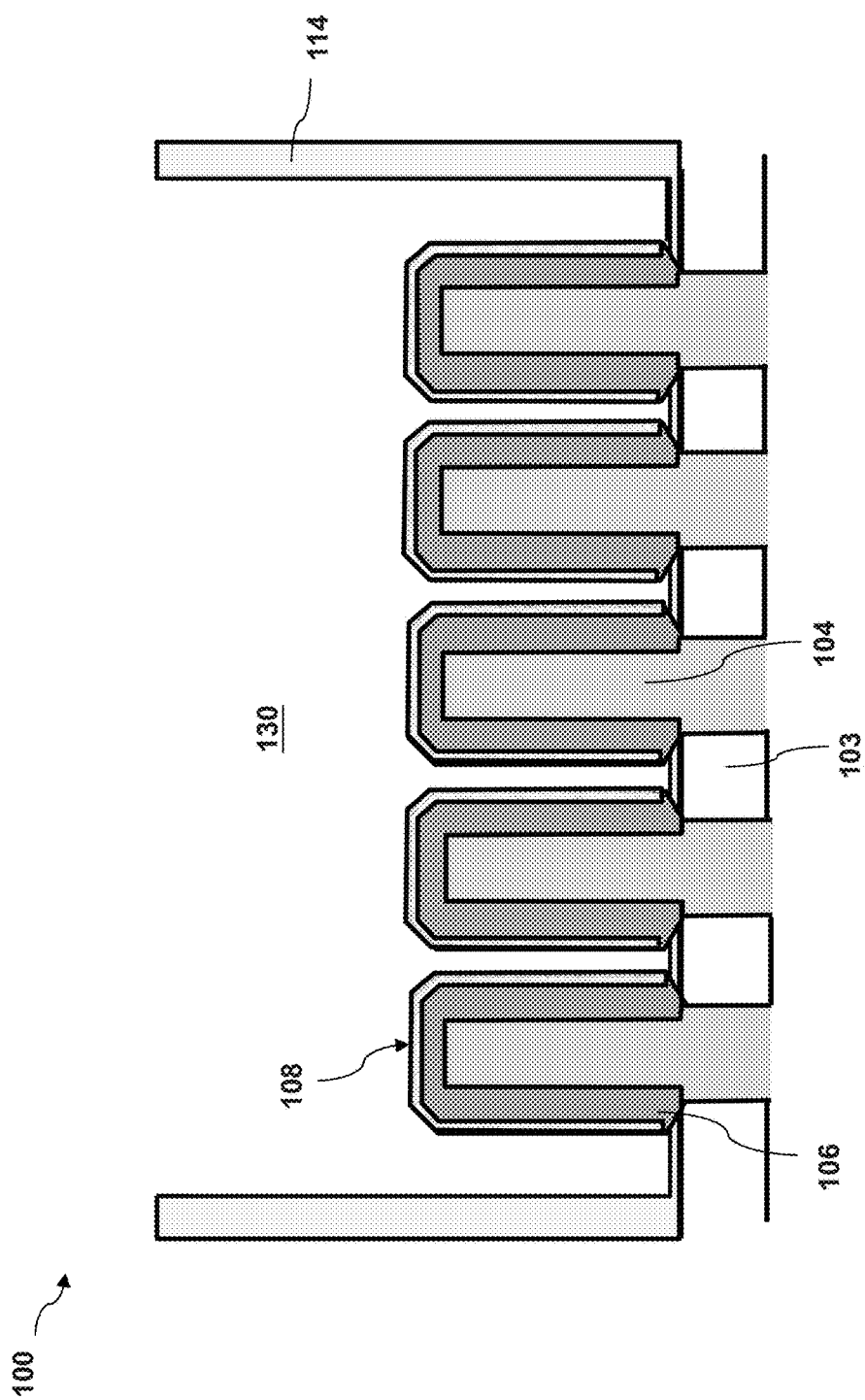

At operation 214, the method 200 (FIG. 2) forms a conduction layer 108 over the semiconductor film 106. Referring to FIG. 13, the conduction layer 108 is conformal to the film 106 and the fin 104. In an embodiment, the conduction layer 108 is a metallization of a portion of the semiconductor film 106, such as by silicidation or germanosilicidation. Silicidation or germanosilicidation generally involves depositing a metal film, performing an annealing process, and removing excess unreacted metal. For example, the metal film may have a thickness of about 5 nm or less, such as 2 nm or less. In embodiments, the same metal film may be used for metallization of both n-type and p-type S/D regions. Alternatively, the metal material used for metallization of the n-type S/D regions may be different from the metal material used for metallization of the p-type S/D regions. In embodiments, the metal film includes titanium (Ti), nickel (Ni), cobalt (Co), tantalum (Ta), erbium (Er), yttrium (Y), ytterbium (Yb), platinum (Pt), or combinations thereof.

In another embodiment, the conduction layer 108 is an ultrathin dielectric layer that helps reduce Fermi-level pinning effects between a metallic material (e.g., the S/D contacts 116 of FIG. 1A) and a semiconductor material (e.g., the semiconductor films 106). The ultrathin dielectric layer may be deposited by atomic layer deposition (ALD). In embodiments, where the conduction layer 108 is formed over n-type S/D regions, the dielectric material may be titanium oxide ($TiO_2$), tantalum oxide ($Ta_2O_5$), or any other dielectrics with a small or negligible conduction band offset $\Delta E_c$ with respect to the semiconductor material in the film 106 and the fin 104. In embodiments, the thickness of the dielectric conduction layer 108 is 1 nm or thinner, such as 0.5 nm or thinner. The small or negligible $\Delta E_c$ as well as the selection of an ultrathin thickness for the conduction layer 108 allows a high current density to flow across without a large voltage drop.

In embodiments, the conduction layer 108 is formed over the film 106 before the ILD layer 114 and the contact hole 130 are formed. In such embodiments, the conduction layer 108 fully covers the film 106 in the S/D regions of the device 100. In the present embodiment, the conduction layer 108 is formed over the film 106 after the contact holes 130 are formed. In such embodiments, the conduction layer 108 only covers the portion of the film 106 exposed by the contact holes 130.

Figure 14:
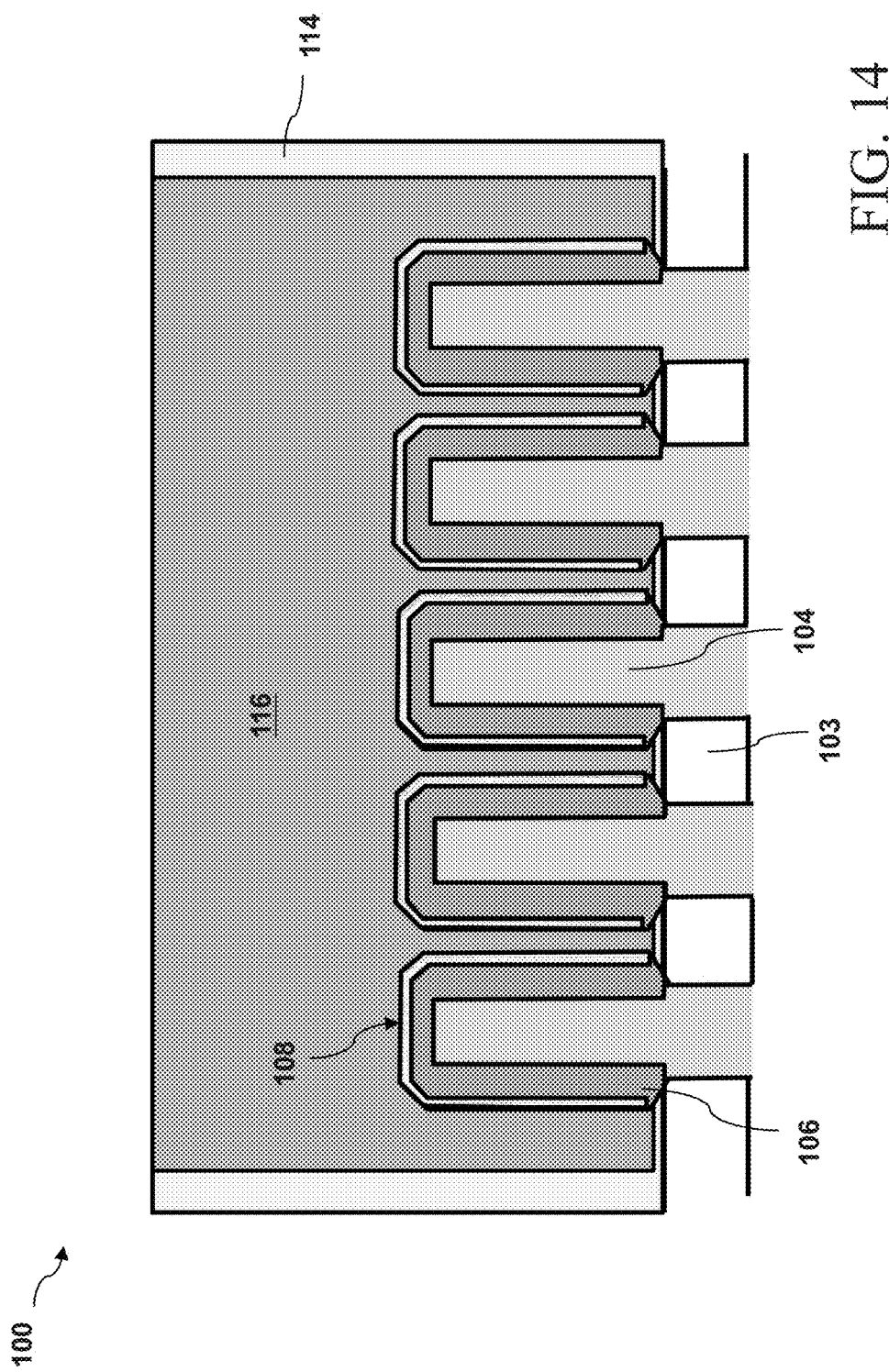

At operation 216, the method 200 (FIG. 2) forms S/D contacts 116 by depositing a metal in the contact holes 130. Referring to FIG. 14, the S/D contacts 116 fill the contact holes 130 and cover the fins 104 through the conformal conduction layer 108 and the film 106. In embodiments, the S/D contacts 116 comprise a metal with a work function of 4.3 eV or lower. In embodiments, the S/D contacts 116 may comprise tungsten (W), cobalt (Co), copper (Cu), other elemental metals, metal nitrides such as titanium nitride (TiN), titanium aluminum nitride (TiAlN), tungsten nitride (WN), tantalum nitride (TaN), or combinations thereof, and may be formed by CVD, PVD, plating, and/or other suitable processes. A CMP process may be performed to planarize a top surface of the device 100 to obtain the structure as shown in FIGS. 1A and 1B.

At operation 218, the method 200 (FIG. 2) performs further steps to complete the fabrication of the device 100. For example, operation 218 may form a gate contact electrically connecting the gate stack 110, and may form metal interconnects connecting the multi-gate FET to other portions of the device 100 to form a complete IC.

Although not intended to be limiting, one or more embodiments of the present disclosure provide many benefits to a semiconductor device and the formation thereof. For example, source/drain (S/D) contacts of the present disclosure provide larger contact areas to S/D regions of a transistor than conventional S/D contacts. The S/D contacts of the present disclosure provide a conformal contact interface that covers multiple surfaces of the S/D regions, including a top surface and two sidewall surfaces thereof. The larger contact areas contribute to lower S/D contact resistance.

In one exemplary aspect, the present disclosure is directed to a semiconductor device. The semiconductor device includes a fin having a first semiconductor material. The fin includes a source/drain (S/D) region and a channel region. The S/D region provides a top surface and two sidewall surfaces. A width of the S/D region is smaller than a width of the channel region. The semiconductor device further includes a semiconductor film over the S/D region and having a doped second semiconductor material. The semiconductor film provides a top surface and two sidewall surfaces that are substantially parallel to the top and two sidewall surfaces of the S/D region respectively. The semiconductor device further includes a metal contact over the top and two sidewall surfaces of the semiconductor film and operable to electrically communicate with the S/D region.

In another exemplary aspect, the present disclosure is directed to a method of forming a field effect transistor (FET). The method includes providing a fin, wherein the fin includes a first semiconductor material and has a source region, a channel region, and a drain region for the FET. The method further includes forming a gate stack over the channel region and trimming the fin to reduce a width of the fin in the source and drain regions. The method further includes forming a semiconductor film over the source and drain regions, wherein the semiconductor film includes a doped second semiconductor material and is substantially conformal to the fin. The method further includes depositing a metal over the semiconductor film, wherein the metal is operable to electrically communicate with the source and drain regions.

In another exemplary aspect, the present disclosure is directed to a method of forming a field effect transistor (FET). The method includes providing a fin, wherein the fin includes a first semiconductor material and has a source region, a channel region, and a drain region for the FET. The method further includes forming a dummy gate stack over the channel region and forming a gate spacer over sidewalls of the dummy gate stack. The method further includes trimming the fin to reduce a width of the fin in the source and drain regions. The method further includes forming a semiconductor film over the source and drain regions, wherein the semiconductor film includes a doped second semiconductor material and is substantially conformal to the fin. The method further includes performing a replacement gate process thereby replacing the dummy gate stack with a metal gate. The method further includes forming contact holes to expose a top surface and two sidewall surfaces of the semiconductor film and depositing a metal in the contact holes.

The foregoing outlines features of several embodiments so that those of ordinary skill in the art may better understand the aspects of the present disclosure. Those of ordinary skill in the art should appreciate that they may readily use the present disclosure as a basis for designing or modifying other processes and structures for carrying out the same purposes and/or achieving the same advantages of the embodiments introduced herein. Those of ordinary skill in the art should also realize that such equivalent constructions do not depart from the spirit and scope of the present disclosure, and that they may make various changes, substitutions, and alterations herein without departing from the spirit and scope of the present disclosure.

What is claimed is:

1. A method of forming a field effect transistor (FET), comprising:
    providing a fin, wherein the fin includes a first semiconductor material and has a source region, a channel region, and a drain region for the FET;
    forming a gate stack over the channel region;
    trimming the fin to reduce a width of the fin in the source and drain regions;
    forming a semiconductor film over the source and drain regions, wherein the semiconductor film includes a doped second semiconductor material and is substantially conformal to the fin; and
    depositing a metal over the semiconductor film, wherein the metal is operable to electrically communicate with the source and drain regions.

2. The method of claim 1, wherein the forming of the semiconductor film is by selectively growing the doped second semiconductor material substantially in the (100) and (110) crystal orientation.

3. The method of claim 1, wherein the forming of the gate stack includes:
    forming a dummy gate stack over the channel region before the forming of the semiconductor film; and
    replacing the dummy gate stack with the gate stack after the forming of the semiconductor film.

4. The method of claim 3, before the trimming of the fin, further comprising:
    forming a gate spacer over sidewalls of the dummy gate stack and a fin spacer over sidewalls of the fin, wherein the gate spacer and the fin spacer are of the same dielectric material;
    selectively modifying the gate spacer to have a different etch resistance than that of the fin spacer; and
    selectively etching the fin spacer thereby exposing the sidewalls of the fin.

5. The method of claim 4, wherein the trimming of the fin also reduces a height of the fin in the source and drain regions.

6. The method of claim 1, before the depositing of the metal, further comprising:
    performing metallization of the semiconductor film to form a metalized layer, wherein the metalized layer covers at least a portion of a top surface and a portion of sidewall surfaces of the semiconductor film.

7. The method of claim 1, before the depositing of the metal, further comprising:
    depositing a dielectric layer over the semiconductor film, wherein the metal is operable to electrically communicate with the source and drain regions through the dielectric layer and the semiconductor film.

8. A method of forming a field effect transistor (FET), comprising:
    providing a fin, wherein the fin includes a first semiconductor material and has a source region, a channel region, and a drain region for the FET;
    forming a dummy gate stack over the channel region;
    forming a gate spacer over sidewalls of the dummy gate stack;
    trimming the fin to reduce a width of the fin in the source and drain regions;
    forming a semiconductor film over the source and drain regions, wherein the semiconductor film includes a doped second semiconductor material and is substantially conformal to the fin;
    performing a replacement gate process thereby replacing the dummy gate stack with a metal gate;

forming contact holes to expose a portion of a top surface and a portion of two sidewall surfaces of the semiconductor film; and depositing a metal in the contact holes.

9. The method of claim 8, wherein the trimming of the fin results in the source and drain regions having a smaller width and a smaller height than the channel region.

10. The method of claim 8, after the forming of the contact holes and before the depositing of the metal, further comprising:

performing metallization of the semiconductor film to form a metalized layer over the portion of the top surface and the portion of the two sidewall surfaces of the semiconductor film.

11. The method of claim 8, after the forming of the contact holes and before the depositing of the metal, further comprising:

depositing a dielectric layer over the portion of the top surface and the portion of the two sidewall surfaces of the semiconductor film, wherein the metal is operable to electrically communicate with the source and drain regions through the dielectric layer and the semiconductor film.

12. A method, comprising:

providing a fin, wherein the fin includes a first semiconductor material and has a source region, a channel region, and a drain region for a transistor;

forming a first gate stack engaging the fin in the channel region;

forming a spacer over the first gate stack and the fin;

selectively etching the spacer on top and sidewalls of the fin; and trimming the fin to reduce a width of the fin in the source and drain regions.

13. The method of claim 12, further comprising:

forming a semiconductor film over the fin in the source and drain regions, wherein the semiconductor film includes a doped second semiconductor material; and depositing a metal over the semiconductor film, wherein the metal is operable to electrically communicate with the source and drain regions.

14. The method of claim 13, before the depositing of the metal, further comprising:

performing metallization of the semiconductor film to form a metalized layer, wherein the metalized layer covers at least a portion of a top surface and a portion of sidewall surfaces of the semiconductor film, wherein the metal is deposited over the metalized layer.

15. The method of claim 13, before the depositing of the metal, further comprising:

depositing a dielectric layer over the semiconductor film, wherein the metal is deposited over the dielectric layer and the dielectric layer reduces Fermi-level pinning effects between the metal and the semiconductor film.

16. The method of claim 15, wherein the dielectric layer includes titanium oxide or tantalum oxide and has a thickness of at most 1 nanometer.

17. The method of claim 12, wherein the fin protrudes out of an isolation structure, and the selectively etching of the spacer on top and sidewalls of the fin leaves a portion of the spacer on a corner at an intersection of the fin and the isolation structure.

18. The method of claim 12, wherein the trimming of the fin also reduces a height of the fin in the source and drain regions compared to another height of the fin in the channel region.

19. The method of claim 13, wherein the forming of the semiconductor film is by selectively growing the doped second semiconductor material substantially in the (100) and (110) crystal orientation.

20. The method of claim 12, further comprising, before the selectively etching of the spacer on top and sidewalls of the fin, selectively modifying the spacer such that it has a different etch selectivity over the first gate stack than over the fin.

\* \* \* \* \*